(12) United States Patent
Vorbach

(10) Patent No.: US 9,240,220 B2
(45) Date of Patent: Jan. 19, 2016

(54) STACKED-DIE MULTI-PROCESSOR

(71) Applicant: PACT XPP TECHNOLOGIES AG, Munich (DE)

(72) Inventor: Martin Vorbach, Lingenfeld (DE)

(73) Assignee: PACT XPP TECHNOLOGIES AG, Munich (DE)

( * ) Notice: Subject to any disclaimer, the term of this patent is extended or adjusted under 35 U.S.C. 154(b) by 0 days.

(21) Appl. No.: 14/810,905

(22) Filed: Jul. 28, 2015

(65) Prior Publication Data

US 2015/0371683 A1  Dec. 24, 2015

Related U.S. Application Data

(63) Continuation of application No. 14/543,306, filed on Nov. 17, 2014, now Pat. No. 9,092,595, which is a continuation of application No. 14/263,185, filed on Apr. 28, 2014, now Pat. No. 8,890,215, which is a (Continued)

(30) Foreign Application Priority Data

| Sep. 19, 2001 | (DE) | 101 46 132 |
| Nov. 5, 2001 | (DE) | 101 54 259 |
| Dec. 14, 2001 | (EP) | 1129923 |
| Jan. 18, 2002 | (EP) | 2001331 |
| Feb. 15, 2002 | (DE) | 102 06 653 |
| Feb. 18, 2002 | (DE) | 102 06 856 |
| Feb. 18, 2002 | (DE) | 102 06 857 |
| Feb. 21, 2002 | (DE) | 102 07 224 |
| Feb. 21, 2002 | (DE) | 102 07 226 |
| Feb. 27, 2002 | (DE) | 102 08 434 |
| Feb. 27, 2002 | (DE) | 102 08 435 |
| Mar. 21, 2002 | (DE) | 102 12 621 |
| Mar. 21, 2002 | (DE) | 102 12 622 |
| May 2, 2002 | (DE) | 102 19 681 |
| May 2, 2002 | (EP) | 2009868 |
| Jun. 12, 2002 | (DE) | 102 26 186 |
| Jun. 20, 2002 | (DE) | 102 27 650 |
| Aug. 7, 2002 | (DE) | 102 36 269 |
| Aug. 7, 2002 | (DE) | 102 36 271 |
| Aug. 7, 2002 | (DE) | 102 36 272 |
| Aug. 21, 2002 | (DE) | 102 38 172 |
| Aug. 21, 2002 | (DE) | 102 38 173 |
| Aug. 21, 2002 | (DE) | 102 38 174 |
| Aug. 27, 2002 | (DE) | 102 40 000 |
| Aug. 27, 2002 | (DE) | 102 40 022 |
| Sep. 6, 2002 | (DE) | 102 41 812 |

(51) Int. Cl.
| H01L 25/00 | (2006.01) |
| H01L 23/498 | (2006.01) |
| G11C 5/02 | (2006.01) |
| G11C 5/06 | (2006.01) |

(52) U.S. Cl.
CPC ... *G11C 5/02* (2013.01); *G11C 5/06* (2013.01)

(58) Field of Classification Search
CPC .. H01L 23/498; H01L 2224/16; H01L 25/074
USPC ............... 257/678–697, 777–796
See application file for complete search history.

(56) References Cited

U.S. PATENT DOCUMENTS 9,099,460 B2 * 8/2015 Cho et al.
9,147,623 B2 * 9/2015 Lua et al.

*Primary Examiner* — Cuong Q Nguyen
(74) *Attorney, Agent, or Firm* — Edward P. Heller, III

(57) ABSTRACT

A plurality of stacked dies has outer dies that permits high heat dissipation. A plurality of processors is located on a first outer die. A plurality of memory elements located on a second outer die. An interconnect structure is located an inner die.

4 Claims, 21 Drawing Sheets

Related U.S. Application Data continuation of application No. 14/149,371, filed on Jan. 7, 2014, now abandoned, which is a continuation of application No. 12/571,173, filed on Sep. 30, 2009, now Pat. No. 8,686,549, which is a continuation of application No. 10/490,081, filed as application No. PCT/EP02/10572 on Sep. 19, 2002, now Pat. No. 8,429,385, which is a continuation-in-part of application No. 09/494,567, filed on Jan. 31, 2000, now Pat. No. 7,174,443, which is a continuation of application No. 08/946,998, filed on Oct. 8, 1997, now Pat. No. 6,021,490.

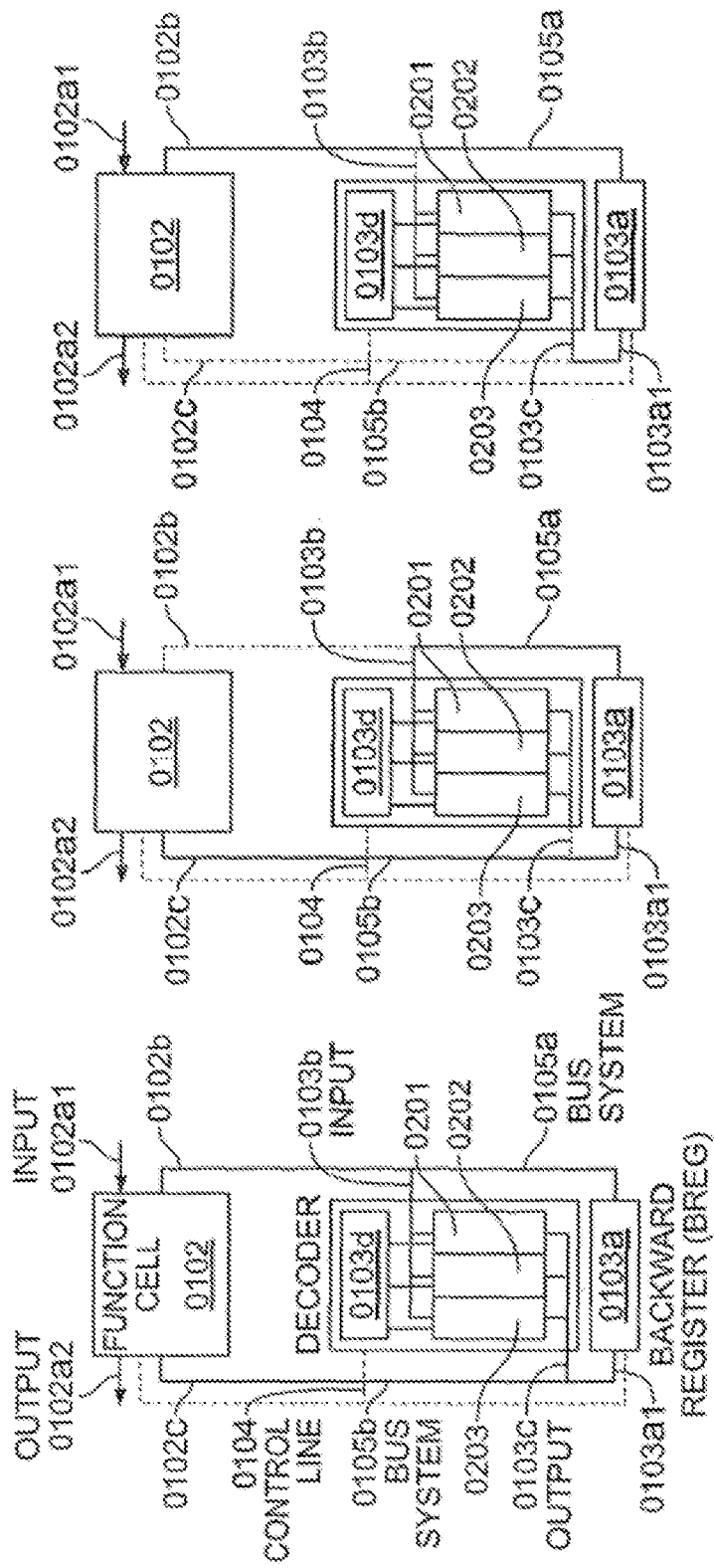

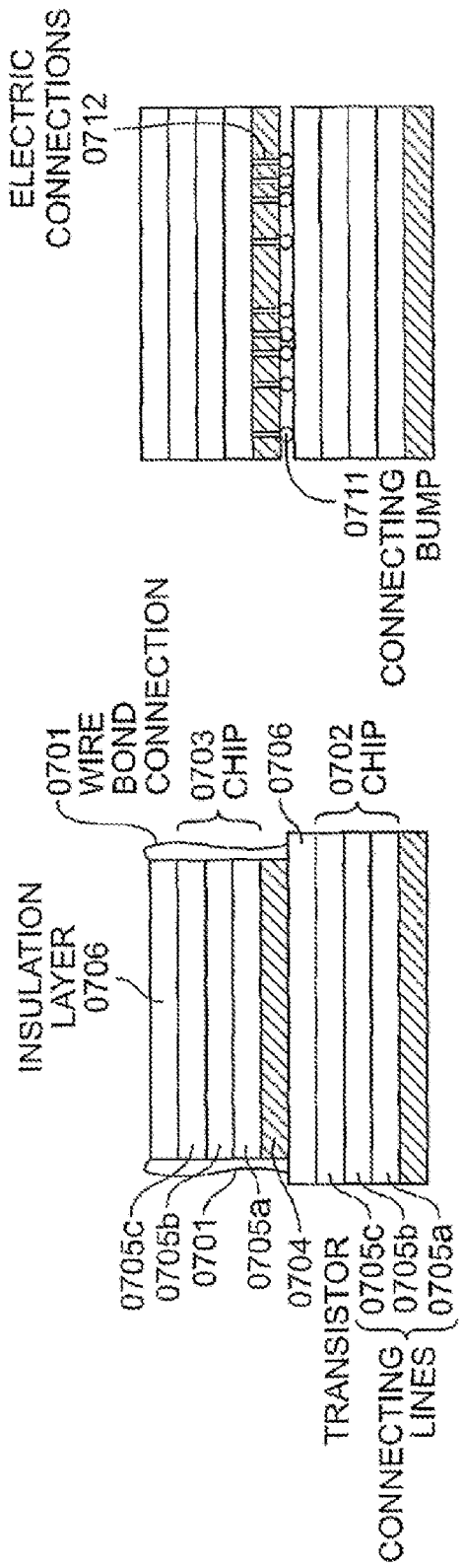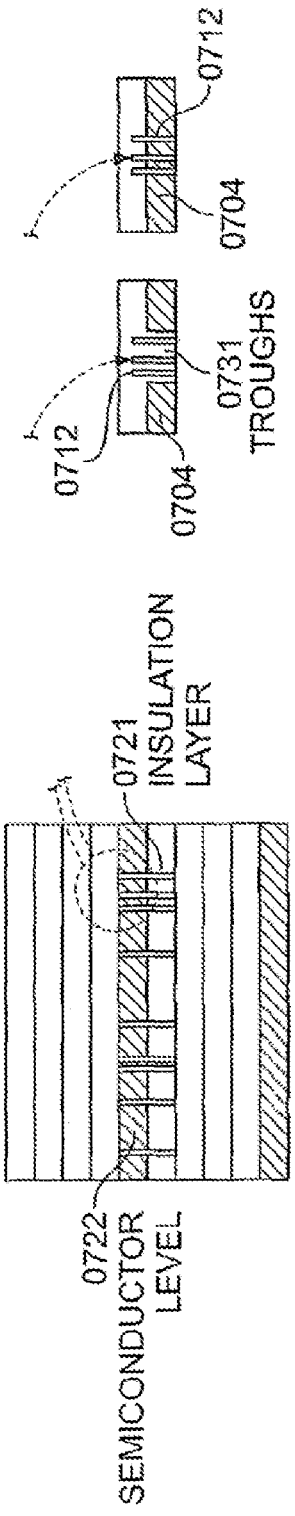

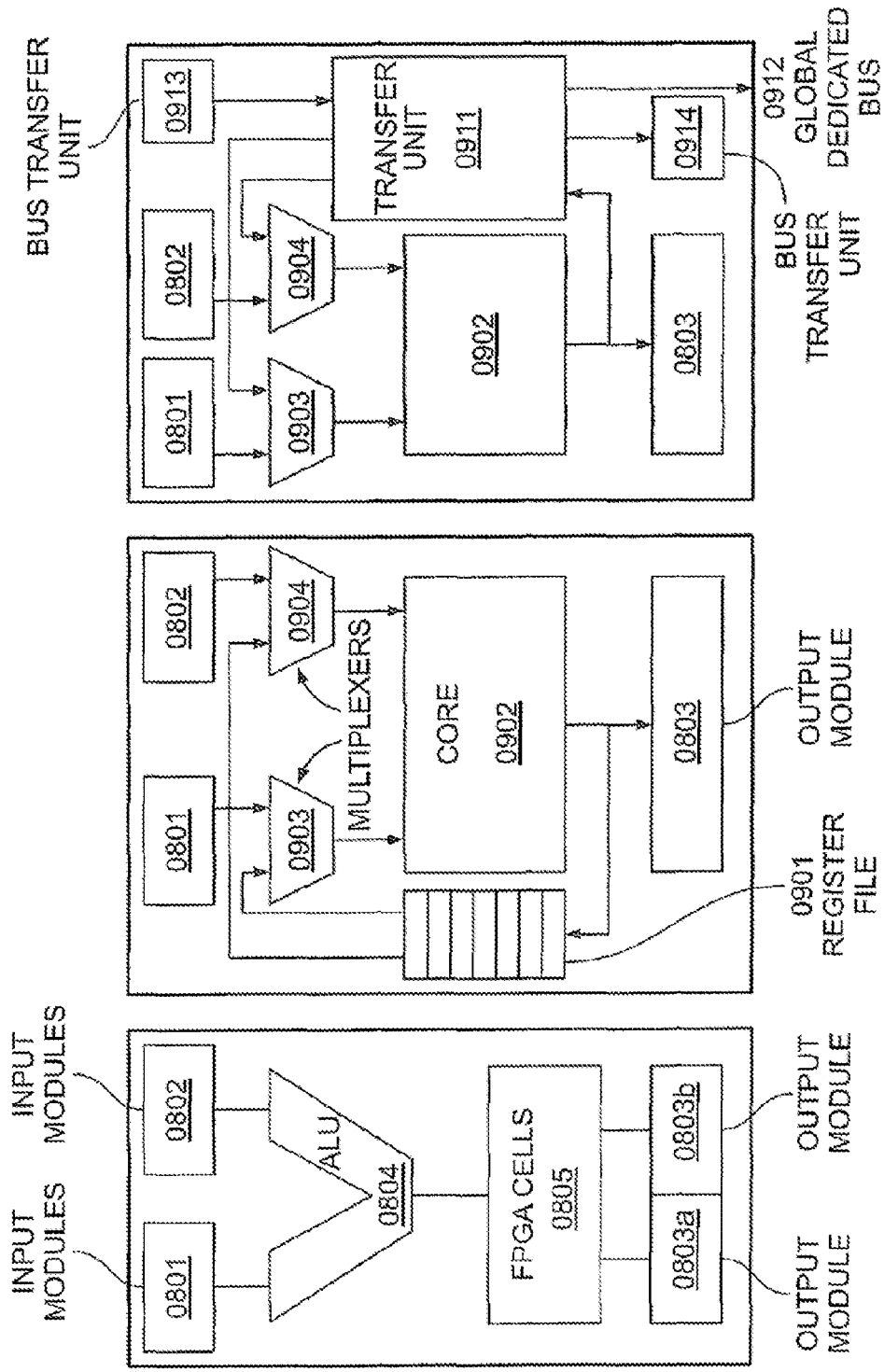

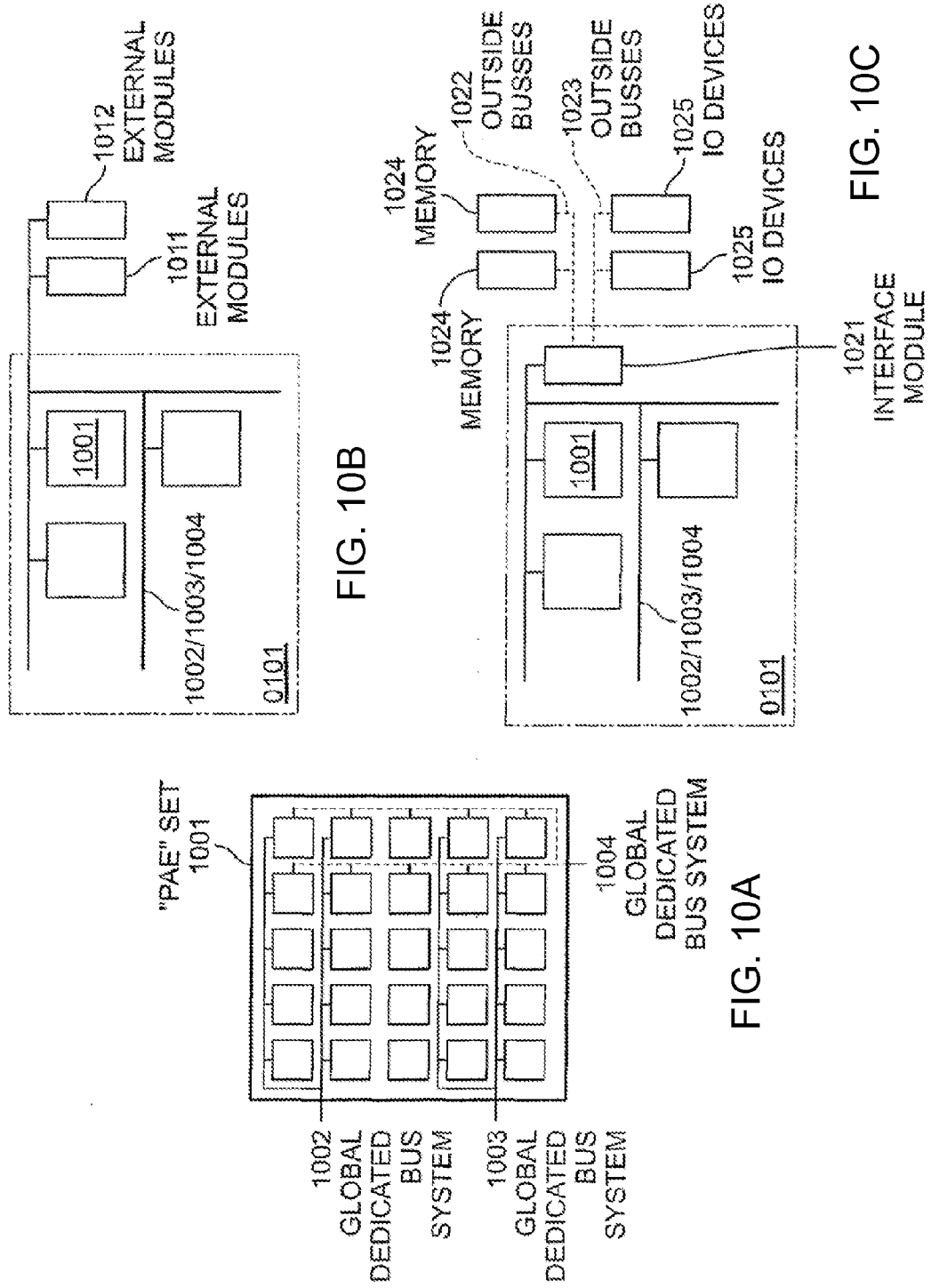

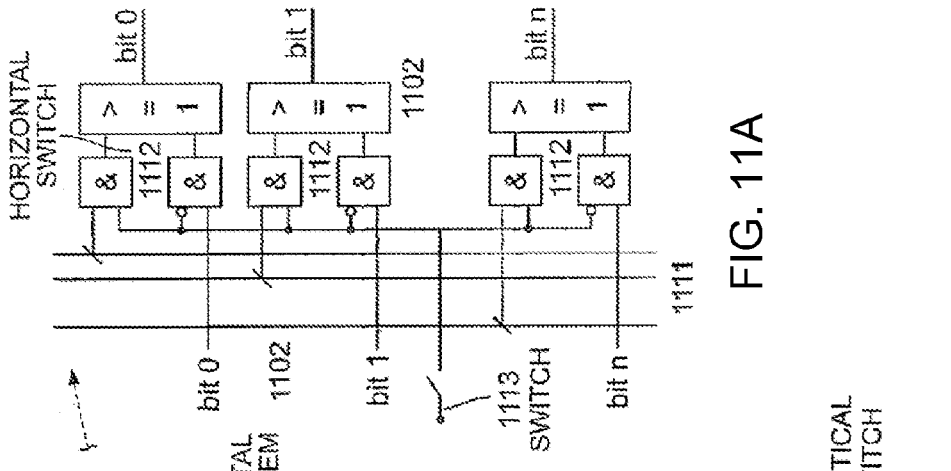
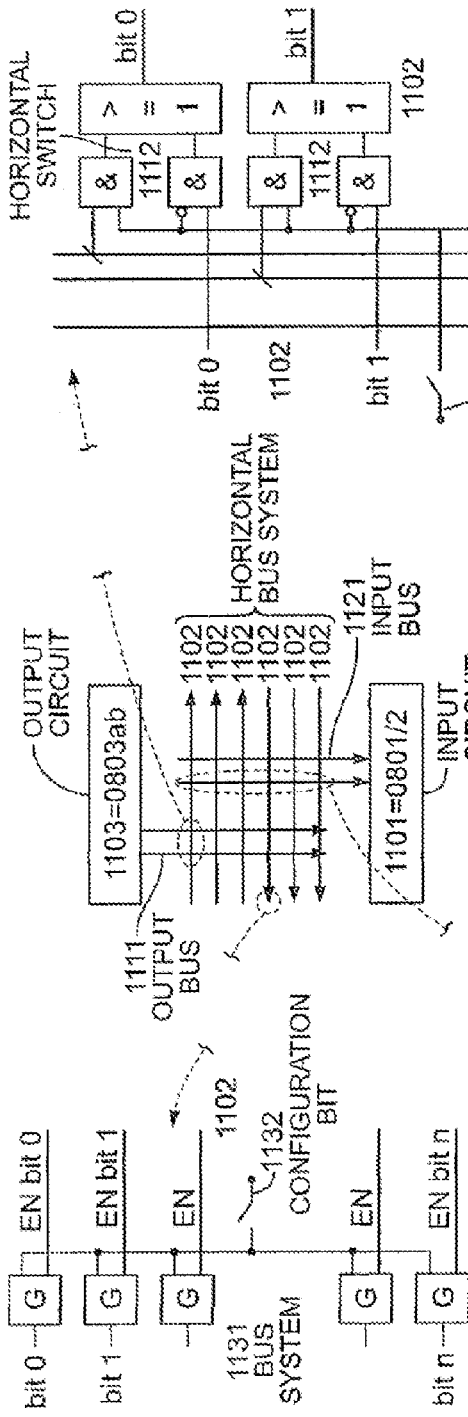
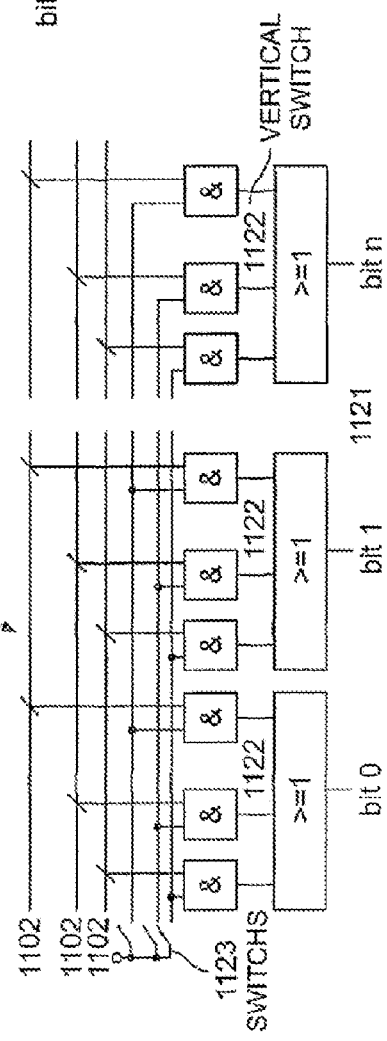
FIG. 11A
FIG. 11B
FIG. 11C
FIG. 11D

STACKED-DIE MULTI-PROCESSOR

CROSS REFERENCE TO RELATED APPLICATIONS

This application is a continuation of and claims priority to U.S. patent application Ser. No. 14/543,306, filed on Nov. 17, 2014, which is a continuation of and claims priority to U.S. patent application Ser. No. 14/263,185, filed on Apr. 27, 2014, now U.S. Pat. No. 8,890,215, which is a continuation of and claims priority to U.S. patent application Ser. No. 14/149,371, filed on Jan. 7, 2014, now abandoned, which is a continuation of and claims priority to U.S. patent application Ser. No. 12/571,173, filed on Sep. 30, 2009, now U.S. Pat. No. 8,686,549, which is a continuation of and claims priority to U.S. patent application Ser. No. 10/490,081, filed on Nov. 29, 2004, now U.S. Pat. No. 8,429,385; which is a continuation-in-part of U.S. patent application Ser. No. 09/494,567, filed on Jan. 31, 2000, now U.S. Pat. No. 7,174,443, which is a continuation of U.S. application Ser. No. 08/946,998, filed on Oct. 8, 1997, now U.S. Pat. No. 6,021,490; and is a national phase of International Application Serial No. PCT/EP/02/10572, filed Sep. 19, 2002, which claims priority to German Patent Applications Serial No. DE 101 46 132.1, filed on Sep. 19, 2001, the entire contents of each of which are expressly incorporated herein by reference.

FIELD OF THE INVENTION

The present invention relates to reconfigurable elements and more specifically to a multiprocessor device on a chip or a stack of chips including a plurality of processing entities.

BACKGROUND INFORMATION

Reconfigurable elements are designed differently depending on the application to be executed and according to the application.

A reconfigurable architecture in the present context refers to modules or units having a configurable function and/or interconnection—Virtual Processing Units (VPUs)—in particular integrated modules having a plurality of arithmetic, logic, analog, memory, and/or internal/external interconnecting modules in one or more dimensions that are interconnected directly or via a bus system.

The generic type of such units includes in particular systolic arrays, neural networks, multiprocessor systems, processors having a plurality of arithmetic units and/or logic cells, communicative/peripheral cells (TO), interconnection and network modules such as crossbar switches, and/or known modules of the generic types Field Programmable Gate Array (FPGA), Dynamically Programmable Gate Array (DPGA), Chameleon, XPUTER, etc. Reference is made in this connection in particular to the following patents and patent applications that have a common assignee with the present application, and all of which are incorporated herein by reference: DE 44 16 881.0-53, DE 197 81 412.3, DE 197 81 483.2, DE 196 54 846.2-53, DE 196 54 593.5-53, DE 197 04 044.6-53, DE 198 80 129.7, DE 198 61 088.2-53, DE 199 80 312.9, PCT/DE00/01869, now U.S. Pat. No. 8,230,411, DE 100 36 627.9-33, DE 100 28 397.7, DE 101 10530.4, DE 101 11 014.6, PCT/EP00/10516, EP 01 102674.7, DE 196 51 075.9-53, DE 196 54 846.2-53, DE 196 54 593.5-53, DE 197 04 728.9, DE 198 07 872.2, 30 DE 101 39 170.6, DE 199 26 538.0, DE 101 42 904.5, DE 102 06 653.1, DE 102 06 857.7, DE 100 28 397.7, DE 101 10 530.4, DE 102 02 044.2, DE 101 29 237.6-53, DE 101 42 904.5, DE 100 50 442.6, DE 101 35 210.7-53, EP 02 001331.4, 60/317,876. The architecture mentioned above is used for illustration and is referred to below as a VPU. This architecture is composed of any arithmetic or logic cells (including memories), memory cells, interconnection cells, and/or communicative/peripheral (10) cells (PAEs) which may be arranged in a one-dimensional or multi-dimensional matrix (PA). The matrix may have different cells of any desired design. The bus systems are also understood to be cells herein. A configuration unit (CT, load logic), which configures the interconnection and function of the P A, may be assigned to the matrix as a whole or parts thereof. The CT may be designed, for example, as a dedicated unit according to PACT05, PACT10, PACT17 or a host microprocessor system according to DE 44 16881.0-53, DE 10206 856.9, and assigned to the PA and/or implemented with the help of or through PAs.

Different PAE structures are known from the related art. The most conventional ones are defined in DE 19651 075.9-53 and DE 10050442.6, as well as Chameleon CS2112. In addition, reference should also be made to the known FPGA cells.

From the university environment, cell structures such as DPGAs, RawMachine (DeHuon), KressArrays (Kress, University of Kaiserslautern), XPUTER (Hartenstein, University of Kaiserslautern) as well as other structures are known.

SUMMARY OF THE INVENTION

The expansions described below which are useable with all the aforementioned structures, may improve the usability of the architectures and PAE structures in complex applications, in particular including highly sequential and/or less data flow-oriented applications. Furthermore, the connection to external units (e.g., memories and/or peripherals) is simplified and homogenized.

Indirect Configuration

In a special embodiment of a PAE (TPAE), it or a group of PAEs is coupled to a memory (RRAM), preferably a RAM-PAE. The IPAE may have its own internal sequencer or it is coupled to a sequencer and/or microcontroller having a, e.g., limited, i.e., comparatively small, number of different possible instructions, like RISC processors and/or a complete set of instructions (see ARC microprocessor). In other words, a risk processor with the smallest possible set of instructions, but which is still complete from the standpoint of computation theory, may be used. In one embodiment, the sequencer may also be formed by configuring one or more PAEs. The sequencer may be designed to be configurable in its function and its sequence behavior (as is known, for example, from the related art, e.g., from EPS448 by Ahera (Altera Data Book 1993)). The sequencer microcontroller may respond to states (e.g., status signals, events) in the IPAE and/or to states (e.g., including triggers) of other PAEs connected to the IPAE (e.g., via a bus system). A pointer to an RRAM memory content may be configured in a register of the IPAE. For example, program pointer Rpp may be set at the starting address of the code during the reset cycle. An address generator in the sequencer may read the memory contents referenced by the pointer out of the RRAM and may either write the contents (or a portion thereof) into a configuration register of an addressed PAE, said configuration register being addressed by the memory content, for example, or may use the memory content as an instruction for the next processing. The pointer may be incremented and/or decremented by the address generator according to the usual procedure of address pointers, and/or reset in the case of jump instructions (JUMP, CALL, RETURN). To this extent, the memory RRAM may also make available a code memory, and, in one embodiment, also a data memory for a sequencer and/or may be used as such. The sequencer may be able to freely read code out of the memory (RRAM), and, in one embodiment, may also read data from or write data into the memory. To this extent, the memory may also constitute a data memory for the sequencer.

The RRAM memory content may be loaded from a higher-level configuration unit (CT). In an extended embodiment, the memory content may, if necessary, also be loaded by the IPAE independently, additionally, or alternatively from another memory (e.g., an external memory) or it may be written into this memory, e.g., via a front-end connection.

In one variant of the embodiment, the memory and/or the IPAE may have a direct connection (EXTBUS) to an external RAM and/or external 10. In one example embodiment, the EXTBUS may be implemented via an optionally dedicated connection of the PAE system to an interface module (TOAG), as is known from PACT03 or PACT15, for example. The memory (RAM) and/or peripheral (10) may be triggered via the interface module.

In an example embodiment of the present invention, the RRAM may automatically load code and/or data for the sequencer from the RAM or an external RAM via the EXTBUS. This function may be implemented by independent address generators implemented or implementable in RRAM. For example, DMA controllers are particularly suitable for this task since they copy data in blocks from one memory to another. The address space of the data to be read and the last target address space may be set accordingly, optionally by the IPAE, and the copying operation may be started.

In an embodiment that is more complex in terms of hardware, the function may be implemented by an implemented memory management unit (MMU) whose general mode of operation is defined by the related art and is known. In the present invention, the MMU may operate as follows:

The RRAM memory managed by the MMU may be divided into multiple pages. Each page may contain data of a virtual memory space within an external memory. For example, the hexadecimal RRAM addresses 0x0a00 . . . 0x0aff may contain data of the external memory at the addresses 0xbd13200 . . . 0xbd132ff. To manage the address conversion, an address translation unit may be used. The unit may be implemented by lookup tables provided in the RRAM cell. The MMU may now be provided in particular for translating a large memory space to the much smaller space of the RRAM. This may be mainly accomplished by copying pages as needed from the large memory space into the small memory space. As soon as a page is no longer needed, it may be deleted and/or overwritten. When the data on the page has been altered, the page may be written back into the large memory space before being deleted/overwritten.

The address conversion unit may then operate in such a way that a high part of the physical address (i.e., the address of the page) is stored in the lookup memory and points to the corresponding data of the page in RRAM as soon as the page is available within the small memory (RRAM). The page may thus be accessed. If the page is not in RRAM, no reference is to be entered either. In this case, the page may first be copied from a large (external) memory space into RRAM. To this end, another page, e.g., one not currently being used, may be overwritten according to the preceding sequence.

The copying may be automated, i.e., it may take place without any major involvement by the sequencer, by having a DMA controller triggered by the MMU. The MMU according to the present invention of the RRAM of the present invention may therefore be provided with a trigger for a DMA controller and/or may be connectable to one. The corresponding page addresses in RRAM and external RAM, as well as the page size, may be made available to the DMA controller by the MMU, e.g., by being entered into registers.

In an example embodiment which may be preferred depending on the application, multiple EXTBUS interfaces may be implemented.

In one example embodiment, the RRAM may be subdivided into multiple segments which are in different address regions. The segments may be divided and/or may be divisible for some of the following functions, for example, and in particular may have a size which permits implementation of some or all of the following functions and corresponding controls which are optionally configurable, but which may be fixedly implemented:

Sequencer/code memories, stacks (e.g., for register sets), data memories, heaps, 10 buffers, buffers to external RAM and/or cache, lookup tables, configurations for PAEs and/or buses, and the register set of the IPAE.

Depending on the function the following triggering mechanisms may be provided and/or configured:

Sequencer/code memories: program pointers to the corresponding memory locations (Rpp);

Stack: stack pointers to the top memory location of the stack (Rsp), if necessary also a frame pointer (Rfp) such as known according to the related art (e.g., Intel Pentium);

Configurations for PAEs and/or buses: a pointer within the CT and/or, depending on the implementation, a pointer within the configuration control of the PAE may point to this; and Register set of the IPAE: if the register set of the IPAE is to be installed in the memory, it is may be addressed directly by the PAE in a fixedly predetermined manner through the hardware.

The remaining memory areas such as data memories, buffers, tables, etc. may be created by the compiler or programmer. These areas may be addressed by the program to be executed and/or the operating system, and the address may be calculated within the program and/or operating system, if necessary with the help of the register set and the ALU of the sequencer. In one example embodiment of the present invention, the register set of the TPAE may be organized as a stack like the register set of transputers. The register set may thus be small in terms of hardware (typically three registers A, B and C are sufficient) and implemented in a particularly efficient manner. In addition, it is known from transputer technology that compilers are able to operate efficiently using such a register set that is inexpensive in terms of hardware. Likewise, the register set may be located in the RRAM.

In one embodiment the RRAM may be designed as a multiport memory.

Multiport memories allow reading and/or write access, if necessary simultaneously, through multiple memory access units to the memory content. Memory access units may include, for example, internal and/or external peripherals, processors, or other PAEs. The function of multiport memories is also known from the related art.

In a special embodiment, the IPAE may operate with the RRAM as a local and, if necessary, also a global configuration unit like a CT for PAEs in the environment or under circumstances it may also fulfill this function. The PAE may operate according to the method known from DE 19654846.2-53 when used as a local configuration unit. If the PAE is used as a global configuration unit or if a great many local PAEs are to be configured, then the method according to DE 19654593.5-53 may be used; this method has a FTLMO functionality and therefore may be capable of managing a great many configurations that are independent of one another. The IPAE may address configurations in the RRAM, e.g., in a manner that is controlled by the sequencer/microcontroller, and may configure them in PAEs and/or itself and/or determine the sequence of the sequencer/microcontroller. Synchronization with a higher-level CT like the inter-CT protocols that are already known may take place here (DE 198 07 872.2, DE 10028397.7, DE 19926538.0). The IPAE RRAM circuit may load a configuration itself via one of the EXTRAM interfaces and/or may request configurations from a higher-level CT via the CT interface. The mode of operation may be similar to that of the reconfiguration unit in DE 19654846.2-53. The configuration data for the PAEs may be relayed through the IRAM to the PAEs or, in one example embodiment, directly from RRAM. For dividing the data in the RRAM among a plurality of PAEs, a bus distribution method like that of the SIMD bus system described in DE 101 10530.4 may be used. In other words, the basic mode of operation of an IPAE RRAM circuit may be like that of a microcontroller system whose bus connection, data transfer, and/or program sequence correspond to those of a VPU system.

Pin an example embodiment of the present invention, IPAE RRAM circuits may be such that the IPAE and the RRAM are each designed as separate function elements (PAEs) of a reconfigurable module and may typically execute any desired connections and functions, but specifically may be configured and used accordingly for use of the sequencer structure described according to the present invention as composed of IPAE and RRAM. The configuration may be accomplished by the higher level configuration unit CT.

Likewise, in an example embodiment of the present invention, PAEs may have, in addition to their connection to the internal bus systems of the arrays of PAEs, a dedicated connection (10 channel) to a superregional bus system which may transmit, in particular, data over long distances within the array and/or, in particular, has direct connection to the peripherals. The connection to the peripherals may be accomplished, e.g., by the bus system already corresponding to the peripheral protocol or via corresponding protocol converters for converting the protocol. The dedicated bus system may already conform to an industrial standard, e.g., PCT, RapidTO, Firewire, USB, Ethernet, RAMBUS, DDR-RAM, etc. to thus permit simple and cost-effective connection of the peripheral devices. Protocol conversions may also be performed in IOAGs (see DE 19654595.1-53) connected in between so that an internal simplified and optionally proprietary bus protocol is translated into one or more more complex external standard protocols. The peripherals may include memories such as those illustrated in the bus protocols listed above.

PAEs may also have multiple connections to dedicated bus systems.

In addition, depending on the application, there may also be architectures in which only a subset of the PAEs has connections to a dedicated bus system or in which different PAEs have a different number of connections to the same or different bus systems.

A detailed description of one example of the coupling of IPAE and RRAM according to the present invention is explained below:

According to an example embodiment of the present invention, in the case of a cell element field for data processing whose function and/or interconnection is reconfigurable, in particular during run time without disturbing the elements that are not to be reconfigured, and which has function cells for execution of algebraic and/or logic configurable functions and which has memory cells for receiving, storing, and/or outputting information, a control connection (CMD) may be created from the function cells to the memory cells. This control connection may be used to make the address input and/or output and/or data input and/or output of the memory be controllable via the associated function cell, e.g., an ALU-PAE. It may thus be possible to specify, for example, whether the next piece of information transmitted is to be handled as an address or as data and whether a read and/or write access is necessary. This data transfer from the memory cell, which may be a RAM-PAE, for example, to the ALU-PAE may allow new instructions which are to be processed by the ALU to be loaded into it. It may be possible in this way to construct a sequencer structure in a cell element field merely by providing a dedicated, exclusively function cell-controlled, control connection between the function cell and memory cell, having only two elements which are connected via suitable buses and to do so without necessitating any other measures and/or any structural changes. Data, addresses, program steps, etc. may be stored in the memory cell in a manner known from conventional processors. Since both elements may also be used accordingly in another manner with an appropriate configuration, this may yield a particularly efficient design which may be particularly readily adaptable to sequencer structures as well as vectorial and/or parallelizable structures.

Through the use of only two cells in a cell element field, namely the function cell and the information providing cell, a multitude of sequencer-like structures may be created in the reconfigurable cell element field. This is advantageous inasmuch as a number of varied tasks that arc different from one another must often be processed in data processing, e.g., in an operating system capable of multitasking. A plurality of such tasks may then be processed in a single cell element field effectively and simultaneously. Advantages for real time applications are apparent. In addition, it is also possible to operate the individual sequencer structures that are constructed in a cell element field, providing the control connection according to the present invention, at different clock pulse rates, e.g., to reduce power consumption by processing tasks having a lower priority more slowly. It may also be possible to process sequencer-like program parts in the field in parallel or vectorially when executing algorithms which are largely parallel and vice versa. The cell element field having the cells whose function and/or interconnection is reconfigurable may form a processor, a coprocessor, and/or a microcontroller, and/or a plurality or combination thereof in parallel.

The function cells may be in the form of arithmetic logic units, in particular representing coarse-grained elements, although they may be provided with a fine-grained status machine. In one example embodiment, the ALUs may be expanded ALUs (EALUs) such as those described in previous patent applications commonly assigned with the present application. An expansion may include the control line monitoring, instruction decoding unit, etc. inasmuch as necessary. At least a subset of the function cells may also be constructed from fine-grained FPGA elements.

The memory cells may provide volatile and/or nonvolatile storage of data and/or information. If information stored in the memory cells, whether program steps, addresses for access to data, or data deposited in a register or in a heap, is stored as volatile data, a complete reconfiguration during operation is possible. As an alternative, it is possible to provide nonvolatile memory cells. The nonvolatile memory cells may be provided as an EEPROM area and the like in which a rudimentary bios program is stored which is to be executed at the time of startup of the configuration. In this way it may be possible to start up operation of a data processing system without other components. A nonvolatile data memory may also be provided if it is decided for cost and/or space reasons that the same program parts are to be executed repeatedly, in which case it may then be possible to switch among such fixed program parts, e.g., in the manner of a WAVE reconfiguration during operation. The possibilities of providing and using such nonvolatile memories are the object of other protective rights commonly owned with the present application. It may be possible to store both volatile and nonvolatile data in the memory cells, e.g., to permanently store a bios program and nevertheless be able to use the memory cell for other purposes.

In an example embodiment of the present invention, the memory cell may be designed in such a way that it is able to store a sufficiently large number of data and/or program parts to be processed. These program parts may be designed as program steps, such that each step specifies what an individual PAE, in particular the assigned PAE, in particular the function cell controlling the memory cell, must do in the next step, and the program parts may also include entire configurations for field areas or other fields. In such a case, it may be possible for the sequencer structure that has been built up to output an instruction on the basis of which cell element field areas are reconfigured. The function cell triggering this configuration then may operate like a load logic (CT) at the same time. The configuration of other cells may in turn be done in such a way that a sequencer-like data processing takes place there, and it may be possible in these fields in turn to configure and/or reconfigure other cells in the course of program processing. This may yield an iterative configuration of cell element areas and nesting of programs with sequencer structures and parallel structures that are nested into one another in a similar manner like a babushka (a Russian stacking doll). By using input and output cells, access to other cell element fields outside of a single integrated module may be possible. Such access may massively increase the total computation capacity. It may be possible, in particular with the occurrence of configurations in a code part of a sequencer structure configured into a cell element field, to either perform the configuration requests on an assigned cell element field, which may be managed by the particular sequencer structure alone, and/or deliver such requests to a configuration master unit to ensure that there is a uniform occupancy of all cell element fields. This may yield more or less a subprogram call by transfer of required configurations to cells or load logics. The cells, if they themselves are responsible for the configuration of other cell element field areas, may be provided with FILMO structures and the like implemented in hardware or software to ensure proper reconfiguration. Another possibility may be that of writing into the memory cells while instructions are being processed in such a way that the code to be processed and/or the program to be processed is altered. In one example embodiment, this type of self-modification (SM) may be suppressed by a corresponding control via the function cell.

In an example embodiment of the present invention, the memory cell, in response to triggering of the function cell controlling it, may place stored information directly or indirectly on a bus leading to the function cell. Indirect output may take place when the two cells are situated side-by-side and the information requested by the triggering unit must arrive at the ALU-PAE via a bus segment that cannot be connected directly to the output of the memory cell. In such a case, the memory cell may output data onto this bus system in particular via a backward register. Accordingly, in an example embodiment of the present invention, at least one memory cell and/or function cell may have such a backward register which may be located in the information path between the memory cell and the function cell. In such a case, this register need not necessarily be provided with additional functionalities, although this may be the case, e.g., when requesting data from the memory cell for further processing according to a conventional LOAD instruction of a typical microprocessor for modification of the data even before being loaded into the PAE in order to implement a LOAD++ instruction, for example.

In other words, within the structure described here, bus connections may be run as needed through the forward register (FREG) and the backward register (BREG) which are typical of the XPP technology commonly owned with the present application. These, in particular, have the possibility of transmitting data vertically between horizontal bus systems and they are able to multiplex or demultiplex multiple buses. FREG and BREG (contrary to their naming) are not necessarily register stages, but, instead, may merely and optionally have configurable registers. The control connection (CMD) may go to the FREG and/or BREG of the particular function cells (PAEs) to control the bus data transfers according to the instruction currently being executed.

The memory cell may be set up in such a way as to receive information from the function cell controlling it, information storage via an input/output cell and/or a cell that does not control the memory cell also being possible. In particular, when data is to be written by an input-output cell into the memory cell, the input-output cell (I/O PAE) may be controlled by the function cell. Then, for example, the address at which information to be written into the memory cell or, if necessary, also to be transmitted directly to the function cell (PAE) is to be read may be sent to the I/O-PAE by the ALU-PAE. In this connection, this address may be stipulated via an address translation table, an address translation buffer, or an MMU-like structure in the I/O-PAE. In such a case, this may result, in particular, in the full functionalities of typical microprocessors.

In one example embodiment of the present invention, the function cell-memory cell combination may be assigned at least one input-output unit with the help of which information may then be sent to an external unit, another function cell, another function cell-memory cell combination, and/or other memory cells, and/or information may be received from them.

The input-output unit may be designed for receiving control instructions from the function cell.

The function cell-memory cell combination may have capabilities for data transfer to the other function cells and/or memory cells of a VPU module, in particular those situated in the array of PAEs (PA). For this purpose, access capabilities via the bus systems to the corresponding cells may be made available. Access may be accomplished via the forward and/or backward registers of the PAEs of the function cell-memory cell combination, through transfer of the "port" control instruction.

In one example embodiment of the present invention, the control connection (CMD) may be designed to transmit at least some, e.g., all, of the following control instructions: OPCODE FETCH, INTERNAL/EXTERNAL DATA ACCESSES, POSITIONING OF INTERNAL/EXTERNAL ADDRESS POINTERS, POSITIONING OF INTERNAL/EXTERNAL PROGRAM POINTERS, PROGRAM POINTER INCREMENT, POSITIONING OF INTERNAL/ EXTERNAL STACK POINTERS, and STACK ACCESSES (PUSH, POP).

For example this functionality may be implemented through the following CMD control instructions:

load const: load a constant into a register;
write_Rap: set address pointer for memory access (e.g., heap);
read_Rap: read address pointer for memory access (e.g., heap);
read_Reg: read a register out of the memory (if the registers are implemented in the RAM-PAE);
write_Reg: write data into a register in the memory (if the registers are implemented in the RAM-PAE);
write&decr_Rsp: write a data word onto the stack and decrement the stack pointer;
read&incr_Rsp: read a data word from the stack and increment the stack pointer;
set_Rpp: set the program pointer; and
set&push_Rpp: write the program pointer onto the stack and reset the program pointer.

The control instructions may be used to control the connected memory cells and function cells (PAEs). In addition, the control instructions may control the data transfer on the bus systems, e.g., by triggering multiplexers, switches, transmission gates, etc., in the forward and backward 30 registers (FREG/BREG).

Additional instructions may include:
Read_port: read data from a port (e.g., implemented by an FREG) to the array; and Write_port: write data to a port (e.g., implemented by a BREG) to the array.

This may be accomplished by a corresponding bit width of the control line and an associated decoding at the receivers. The required control and decoding may be provided inexpensively and with no problem. As this shows, practically complete sequencer capability of the system may be obtained with the signals. An all-purpose data processing unit may be obtained in this way.

The system may be selected so that the function cell, as the only master, may access the control connection and/or a bus segment, i.e., a bus system that functions as the control connection. Therefore, this may yield a system in which the control line functions as an instruction line, as provided in conventional processors.

The function cell may be situated adjacent to the memory cell and I/O cell respectively. For example, they may be situated directly side-by-side. Alternatively, they may at least be close to one another. The system of function cells and memory cells in proximity to one another may ensure that there is no latency time or at least no significant latency time between triggering and data input of the required information in the function cell only because the connections between the cells are too long. If latency times must be taken into account, then pipelining may also be provided in the sequencer structures. This becomes particularly important in systems having a very high clock pulse frequency. It is possible to provide cell units having such a high clock pulse frequency, which are known in the related art and are also able to access suitable memory cells rapidly enough. In such a case, e.g., when architecture elements that are known are used for the function cells, reconfigurability of the function cell element and the respective interconnections are also to be provided at the same time. In one example embodiment, the function cells, the information providing cells such as memory cells, the I/O cells, and the like may be in a multidimensional arrangement, in particular in the manner of a matrix and/or at grid points of a one-dimensional grid, etc. If there is a regular structure, as is the case there, a cell may receive information, i.e., operands, configurations, trigger signals, etc., from a first row, while data, trigger signals, and other information is dispensed in a lower row. In such a case, it may be preferable for the cells to be situated in one and the same row, and then the information transfer from the information providing cell into the required input of the function cell may take place via a backward register. The registers may be used for pipelining.

In an example embodiment of the present invention, a method may be provided for operating a cell element field, in particular a multidimensional cell element field having function cells for executing algebraic and/or logic functions and having information providing cells, in particular memory cells and/or input/output cells, for receiving and/or outputting information and/or memories thereof. At least one of the function cells may output control instructions to at least one information-providing cell, where information may be provided for the function cell in response to the control instructions. The function cell may be designed to perform further data processing in response to the information provided, to thereby process data like a sequencer.

Thus, in an example embodiment of the present invention, in a reconfigurable field, data processing in a sequencer-like manner may be made possible by outputting the control instructions to the memory cell of a sequencer structure. The instructions, which may be output as control instructions by the function cell, may permit a sequencer-like operation such as that known from conventional processors. It may be possible to implement only parts of said instructions and nevertheless ensure fully sequencer-like data processing.

BRIEF DESCRIPTION OF THE DRAWINGS

FIG. 2A is a diagram that illustrates additional details of the cell element field illustrated in FIG. 1, according to an example embodiment of the present invention.

FIGS. 2B and 2C are diagrams that illustrate the details of FIG. 2A during different data processing times, according to an example embodiment of the present invention.

FIG. 7A to FIG. 7H show various design variants of semiconductor stacks, according to embodiments of the present invention.

FIG. 8 is a diagram that illustrates an example PAE, according to an example embodiment of the present invention.

FIG. 9A and FIG. 9B illustrate example PAEs that may be implemented according to example embodiments of the present invention.

FIG. 10A to FIG. 10C illustrate the use of dedicated global bus systems according to example embodiments of the present invention.

FIG. 11A to FIG. 11D are diagrams that illustrates bus switches, according to example embodiments of the present invention.

DETAILED DESCRIPTION OF THE INVENTION

Figure 1A:
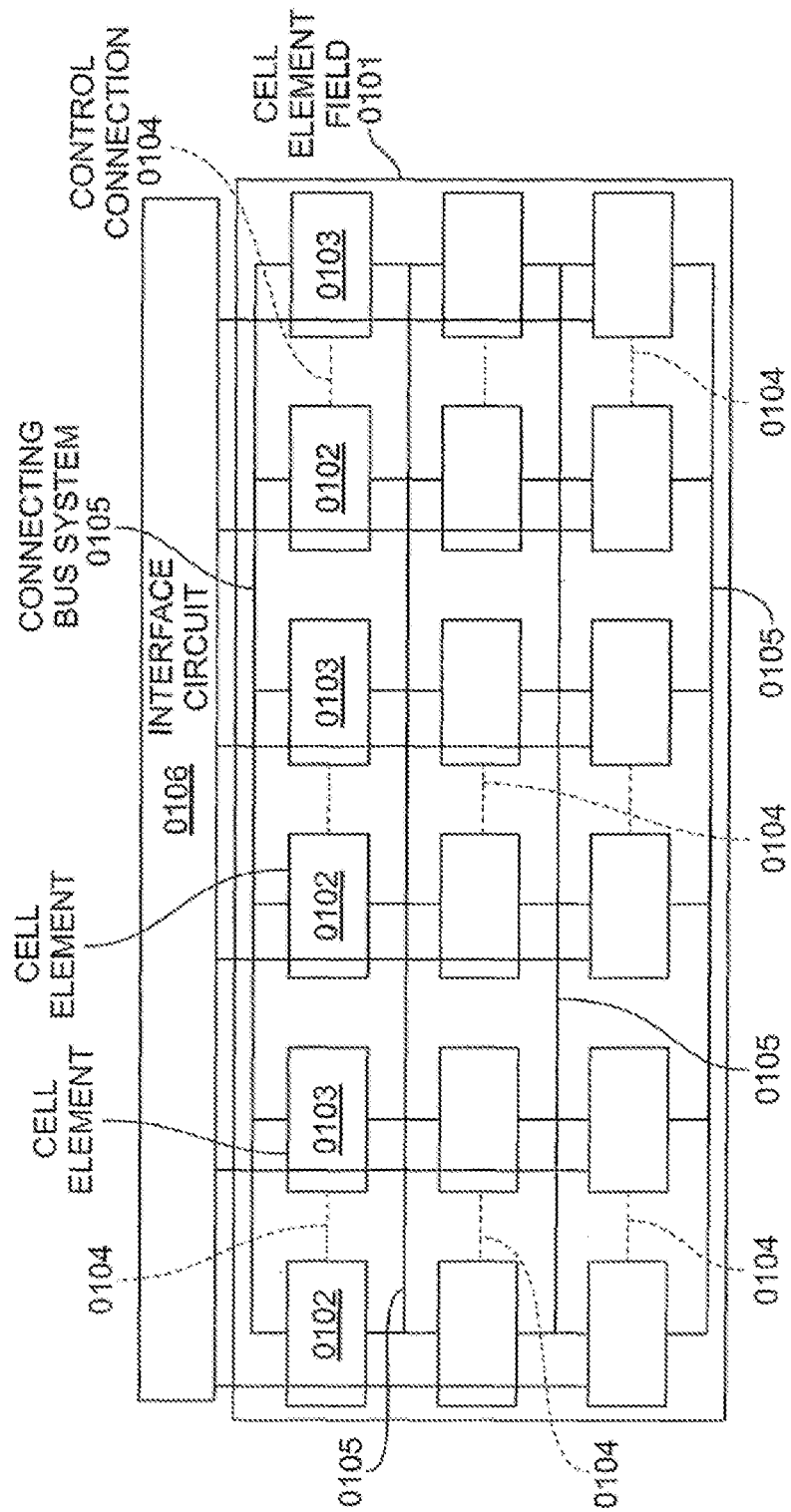
FIGS. 1A and 1B are diagrams that illustrate a cell element field according to an example embodiment of the present invention.
Figure 1B:
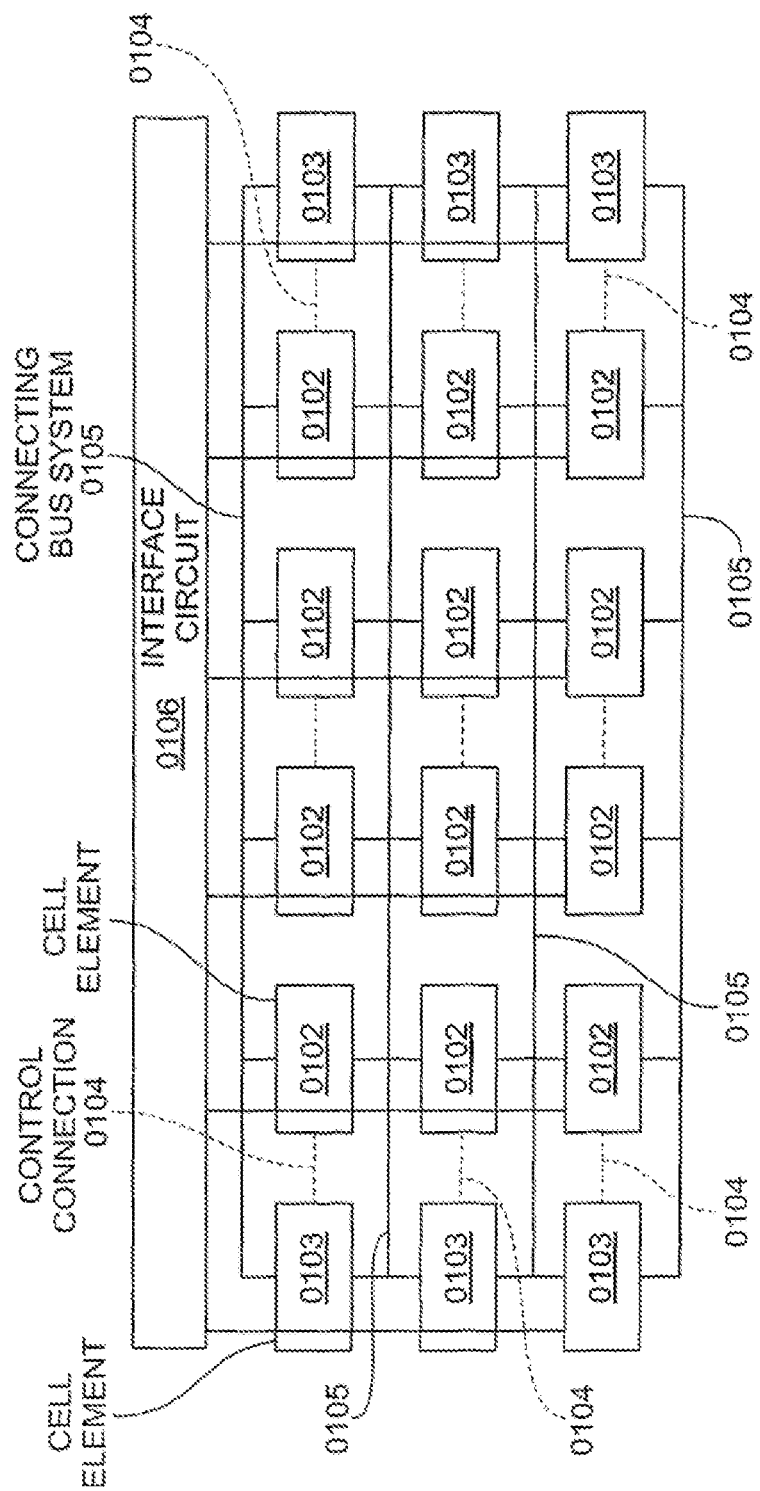

Referring to FIG. 1 (A/B), a cell element field, designated in general as 0101, for data processing may include function cells 0102 for executing arithmetic and/or logic functions, as well as memory cells 0103 for receiving, storing, and/or outputting information, and a control connection 0104 leading from function cells 0102 to memory cells 0103.

Referring to FIG. 1A, the cell element field 0101 may be freely configurable in the interconnection of elements 0102, 0103, 0104, without interfering with ongoing operation of cell element parts that are not to be reconfigured. The connections may be configured by connecting bus systems 0105 as necessary. In addition, the particular function of function cells 0102 may be configurable. The function cells may be arithmetic logic units which have been expanded by certain circuits that permit reconfiguration such as status machines, interface circuits for communication with load logic 0106 situated outside of the cell element field, etc. Reference is made to the corresponding prior applications commonly owned with the present application.

Cell elements 0102, 0103 of cell element field 0101 may be situated in two dimensions, in rows and columns, with one memory cell 0103 being directly next to a function cell 0102, there being three memory cell-function cell pairs per row in which the function cells and memory cells are interconnected via control connections 0104. Function cells and memory cells 0102, 0103 may have inputs which are connectable to the bus system above the row in which the particular cell elements are connectable to receive data therefrom. In addition, cells 0102, 0103 may have outputs which output data to bus system 0105 beneath the row. As already explained, each memory cell 0103 may also be connected to a backward register (BW) through which data may be pushed from the bus beneath a row to the bus above the particular row.

With the exception of control connections 0104 and the associated circuits within the function cells (ALU in FIG. 2) and memory cells (RAM in FIG. 2), the cell element field for data processing in FIG. 1 may be a conventional cell element field such as that already known and conventional with reconfigurable data processing systems, e.g., a VPU corresponding to the XPP technology commonly owned with the present application. In particular, the cell element of FIG. 1 may be operated in the known way so it has the corresponding circuits for wave reconfiguration, for debugging, for transmission of trigger signals, etc.

The particulars of the cell element field of the present invention may be derived from control connection 0104 and the associated circuit which is described in greater detail below with reference to FIGS. 2A through 2C. Whereas a control connection 0104 in FIG. 1 may always lead from a function cell element further to the left to a memory cell further to the right, and specifically only to one such memory cell, a configurable interconnection may also be provided for the control lines to either respond to memory cells located elsewhere and/or if necessary be able to respond to more than one memory cell when there is a memory demand for information to be received, stored, and/or output by the memory cells on a large scale. For reasons of simplicity and to facilitate understanding of the present invention, however, reference is made in FIGS. 1 and 2 only to fixedly provided individual control connections. Moreover, the control connection may be, if necessary, substitutable by conventional lines, assuming there are appropriate protocols.

FIG. 2 shows function cell 0102 as an ALU and function cell 0103 as RAM. Above the row in which the cells are located, bus 0105a runs, connecting backward register 0103a already mentioned to inputs 0103b of the memory cell and 0102b of the ALU. The bus system running beneath the row is labeled as 0105b and only the relevant segments of bus system 0105a, 0105b are shown. This shows that bus system 0105b alternatively receives data from an output 01 02c of ALU 0102 and an output 0103c of RAM 0103 and carries data into input 0103a1 of the backward register.

At the same time ALU 0102 may have additional inputs and outputs 0102a1, 0102a2 which may be connected to other bus segments and over which the ALU may receive data such as operands and/or outputs results.

Control connection 0104 may be permanently under the control of the expanded circuits of the ALU and may represent a connection via which a plurality of bits may be transmitted. The width of control connection 0104 may be selected so that at least the control instructions described previously may be transmitted to the memory cell and the forward/backward register (FREG/BREG). Memory cell 0103 at the same time may preferably have three memory areas, namely a stack area, a heap area, and a program area. Each area may be assigned its own pointer via which it may be determined which area of the stack, the heap and the program area is accessed for reading or writing.

Bus 0105a may be used jointly by units 0102 and 0103 by the time multiplex method. This is indicated in FIGS. 2B, 2C. For example, FIG. 2B shows a situation in which data may be sent from output 0102a2 of the ALU-PAE via the backward register to the input of the RAM cell, whereas the connection between output 0103 of the RAM to bus 0105b existing at the same time although not in use and the connection between the output of backward register BW and input 0102b of the ALU-PAE do not have any importance at the point in time of FIG. 2B, which is why this is indicated with a dashed line. However, FIG. 2C shows a point in time at which memory cell 0103 supplies information about the backward register to input 2b of ALU-PAE 0102 via its output 0103c from the memory area of stack (0203), heap (0202) and program (0201) determined via the control line 0104, while the output of ALU-PAE 0102c is inactive and no signal is received at input 0103b of the RAM-PAE. For this reason, the corresponding connections are indicated with dashed lines and are thus depicted as being inactive.

Within RAM cell 0103, a circuit 0103*d* may be provided in which the information received via control line 0104 and/or control line bus segment 0104 is decoded.

An embodiment of the present invention may be used as follows:

First, ALU 0102 may receive configuration information from a central load logic as is already known in the related art. The transfer of information may take place in a manner known using the RDY/ACK protocol and the like. Reference is made to the possibility of using a FILMO memory, etc. with the load logic to permit proper configuration of the system.

Using the data for the configuration of ALU 0102, a row of data may be transmitted from the load logic at the same time, representing a program to be processed in a sequencer-like manner. This program may either already be the program to be executed for calculation and/or execution of the application or it may be a boot program which first loads the application be omitted if a portion of the memory assigned to the ALU (e.g., RAM, EPROM, EEPROM, Flash ROM) is designed to be nonvolatile and a boot program or the application program is permanently stored there. This may be an advantage in particular when the application is known in advance and may be designed to be unmodifiable because fixed implementation may result in a considerable cost reduction. Therefore, during its configuration, the ALU may output on line 0104 a corresponding instruction which sets the program pointer for writing at a predetermined value within the RAM. Then, data received by the load logic in the ALU may be supplied via output 0102*c* over bus 0105*b* and backward register 0103*a* and may proceed to input 0103*b* of RAM-PAE 0103. From unit 0103*d*, data may then be written into the program memory location identified according to the control instruction on control line 0104. This may be repeated until all program parts received by the load logic in the configuration have been stored in memory cells 0103. When configuration of the ALU is then concluded, it will request the next program steps to be executed sequencer-like by it by outputting the corresponding instructions on control line 0104 and it will receive them at its input via output 0103*c*, bus 0105*b*, the backward register of RAM-PAE 0103 and bus 0105*a*. During the program processing, situations may occur in which jumps are necessary within the program memory area, e.g., data may be loaded into the ALU-PAE from the RAM-PAE and/or data may be stored in the stack, etc.

Communication in this regard between ALU-PAE and RAM-PAE may take place via control line 0104 so that the ALU-PAE may perform the decoding at any point in time. Moreover, as with a conventional microprocessor, data may be received from a stack or another RAM memory area and data may also be received from outside as operands in the ALU-PAE.

Processing of the program sequence preconfigured by the load logic in the RAM-PAE may take place here. Instruction decoding may take place in the ALU at the same time, as is necessary. This may be carried out with the same circuits that have already been used for decoding the instructions received by the load logic.

Control line 0104 may be monitored via the ALU at each point in time so that the RAM cell always follows exactly the type of memory access specified by the ALU. In this way, it may be ensured that regardless of the time multiplex use of bus elements 0105*a*, *b*, the elements present in the sequencer structure may be informed at any time of whether addresses for data or codes to be retrieved and/or written are on the buses or whether data is to be written and, if so, where, etc.

The system shown with respect to FIG. 2 may be expanded or modified in various ways. The variants depicted in FIGS. 3A and 3B may be particularly relevant.

Figure 3A:
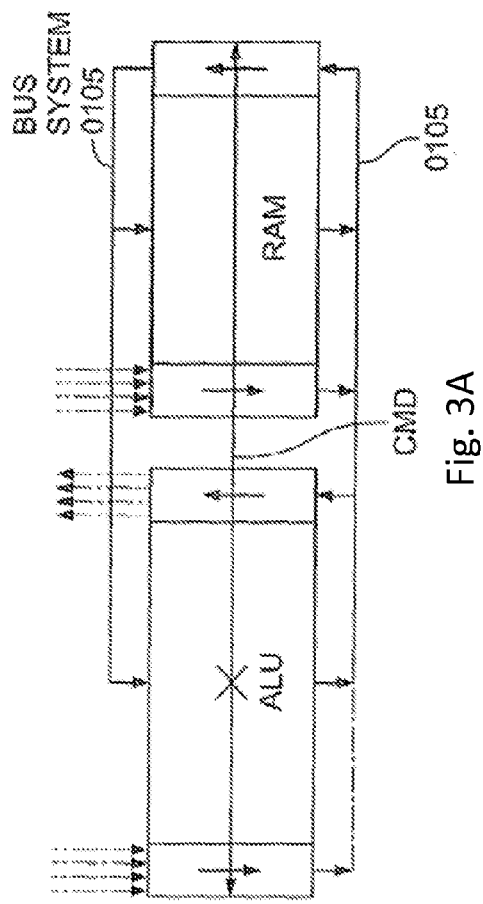
FIG. 3A is a diagram that illustrates the detail of FIGS. 2A-C, according to an alternative example embodiment of the present invention.

According to FIG. 3A, not only a backward register is provided on the RAM-PAE for connecting upper and lower buses but also a forward register is provided on the RAM-PAE, and forward and backward registers are provided on the ALU-PAE. As indicated by the multiple arrows, these may be used to receive and send data to and from other units such as external hosts, external peripheral devices such as hard drives, main memories, and the like, and/or from other sequencer structures, PAEs, RAM-PAEs, etc. When a corresponding request instruction for new program parts is sent from the sequencer structure formed by the ALU-PAE and the RAM-PAE, it may be possible to process program blocks in the sequencer structure that are much larger than those which may be stored in the RAM-PAE. This is an enormous advantage, in particular in complex data processing tasks, jumps over large areas, in particular in subprograms, etc.

Figure 3B:
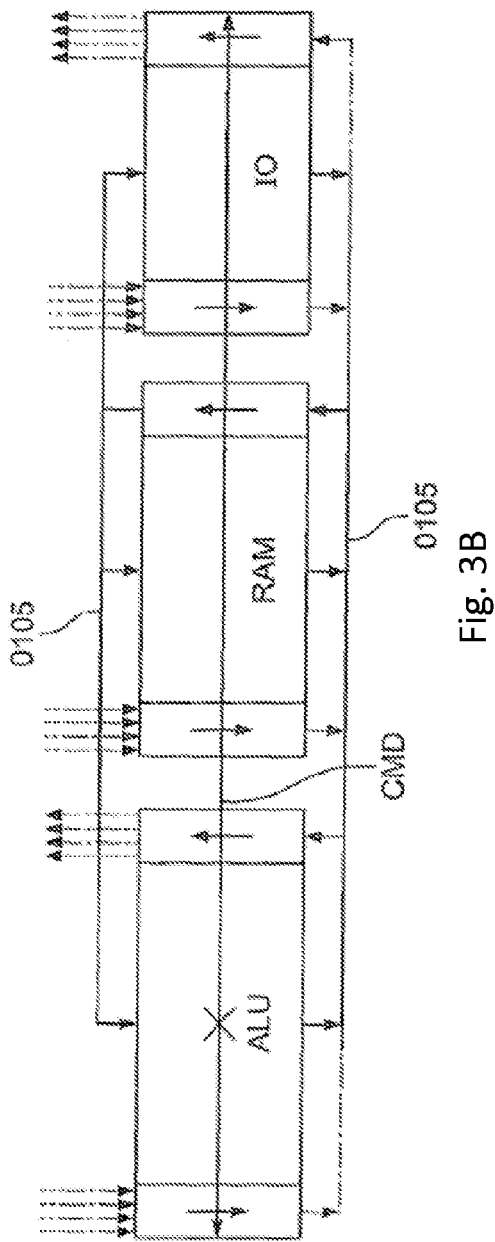
FIG. 3B is a diagram that illustrates further details of the embodiment presented with respect to FIG. 3A, according to an example embodiment of the present invention.

FIG. 3B shows an other variant. The ALU-PAE here communicates not only with a RAM-PAE but also at the same time with an input-output PAE which is designed to provide an interface circuit for communication with external components such as hard drives, other XPP VPUs external processors, and coprocessors, etc. The ALU-PAE may be again the unit that operates as the master for the control connection designated as "CMD" and again the buses may be used in multiplex operation. Here again, data may be transmitted from the bus beneath the row to the bus above the row through the backward register.

The arrangement shown in FIG. 3B may make it particularly simple to design external accesses to information that cannot be stored in the RAM-PAE memory cell and may thus permit an adaptation of the sequencer structure to existing conventional CPU technologies and their operating methods to an even greater extent than may be implemented in the input-output cell, address translation means, memory management units (MMU functions), and the like. The RAM-PAE here may be designed as a cache, for example, or, in particular, as a preloaded cache.

It should be pointed out that multiple sequencer structures may be configured into the same field at the same time; that function cells, memory cells, and input-output cells, if necessary, may optionally be configured for sequencer structures, and/or in a manner conventionally used with XPP technology, and it may be possible for an ALU to output data to another ALU, configuring the latter in a sequencer-like manner and/or making it part of a cell element field using which a certain configuration is processed. Then the load logic may also become dispensable in this way.

FIG. 4 shows again in detail the basic structure of a PAE. The core of a PAE, typically including one or more ALUs and/or a memory and/or FPGA elements, may receive data from bus system OI05*a* and transmit the results of the data processing to bus system 0105*b*. The forward register (FREG 0402) and the backward register (BREG 0403) may be located next to the core and transmit data from 0105*a* to OI05*b* (FREG) and/or from 0105*b* to 0105*a* (BREG). BREG and FREG may also contain one or more ALUs and/or a memory and/or FPGA elements. Preferably, however, their scope of function is restricted with respect to the core (0401).

Bus systems 0105*a* and 0105*b* may be each subdivided into a bus system for transmission of data (DATA) and a bus system for transmission of triggers, i.e., status signals (TRIGGER).

The PAE may be configured by a higher-level configuration unit (e.g., a CT) which may transmit configuration words to the PAE via a configuration bus (0404). These configuration words may be stored in configuration registers (0405). If necessary, a configuration stack (0406) according to PACT17 may be connected in-between and, as described below, it may be connected between the configuration bus (0404) and the configuration registers (0405).

The configuration stack may receive data and/or preferably triggers from bus system 0105(*a*/b) and may send the data and/or triggers to them.

The PAE may optionally have a connection to a dedicated bus system (IO channel 0407). To control the bus system, an additional bus control unit (0408) may be connected to the core (0401). The PAE may transmit data over the IO channel directly using a global memory, optionally also an external memory, and/or a peripheral and/or other PAEs.

In one example embodiment of the present invention, there is the possibility of setting constants for data processing via 0404. In another embodiment, a configuration unit (e.g., a CT) may read data out of the working registers.

Figure 4:
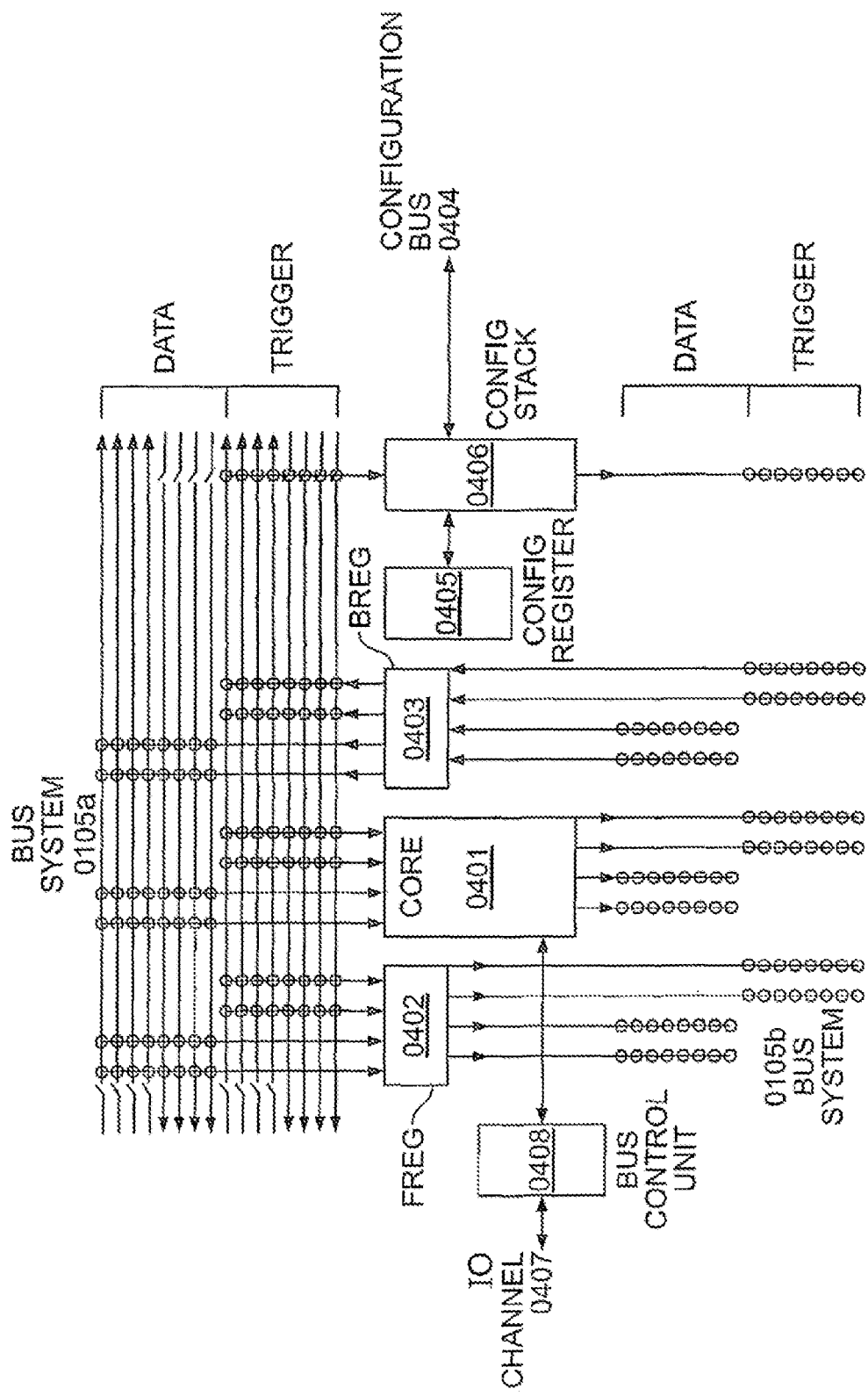
FIG. 4 is a diagram that illustrates a basic design of a function cell/memory cell (PAE), according to an example embodiment of the present invention.

FIG. 4 may also represent a corresponding RAM-PAE. Then the interconnection and function of the RAM may be set by a CT via 0404. The function may include the following functions or combinations thereof in particular:
1. Random access;
2. FIFO;
3. Stack;
4. Cache; and
5. Page memory for MMUs.

In addition, in one example embodiment, the memory may be preloaded with data by the CT (e.g., constants, lookup tables, etc.). Likewise, in an expanded embodiment, the CT may read back data (e.g., for debugging or task change) out of the memory via 0404.

In one example embodiment, a RAM-PAE may have multiple connections to bus system 0105 (dual port or multiport) so that multiple data transfers may be performed at the same time.

In another embodiment the RAM-PAE may have a dedicated connection to an external bus.

RAM-PAEs may be connected in such a way that a memory which is n times larger may be formed from multiple (n) RAM-PAEs.

Figure 5A:
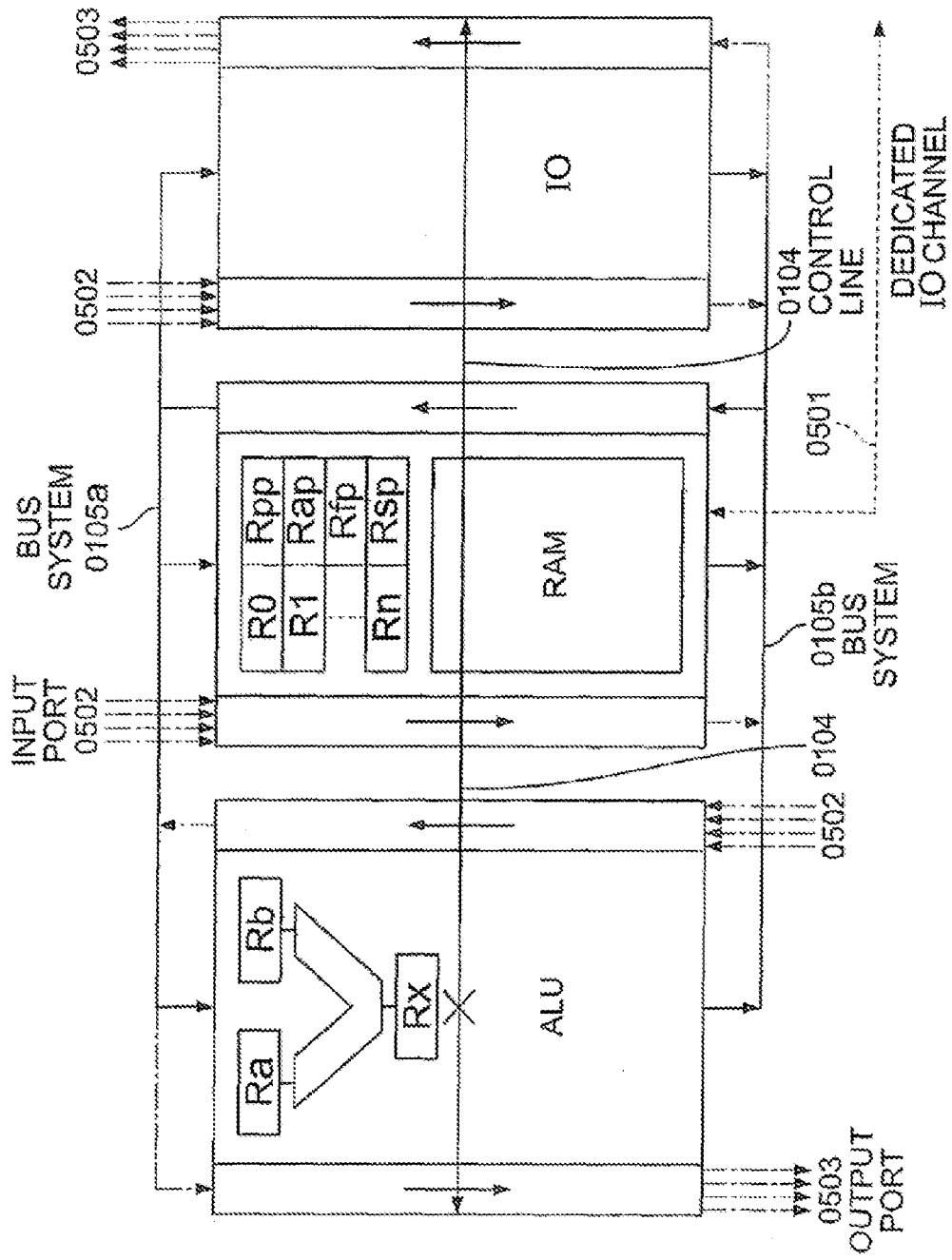
FIG. 5A and FIG. 5B are a diagram that illustrates details of an embodiment presented with respect to FIG. 3B, according to an example embodiment of the present invention.
Figure 5B:
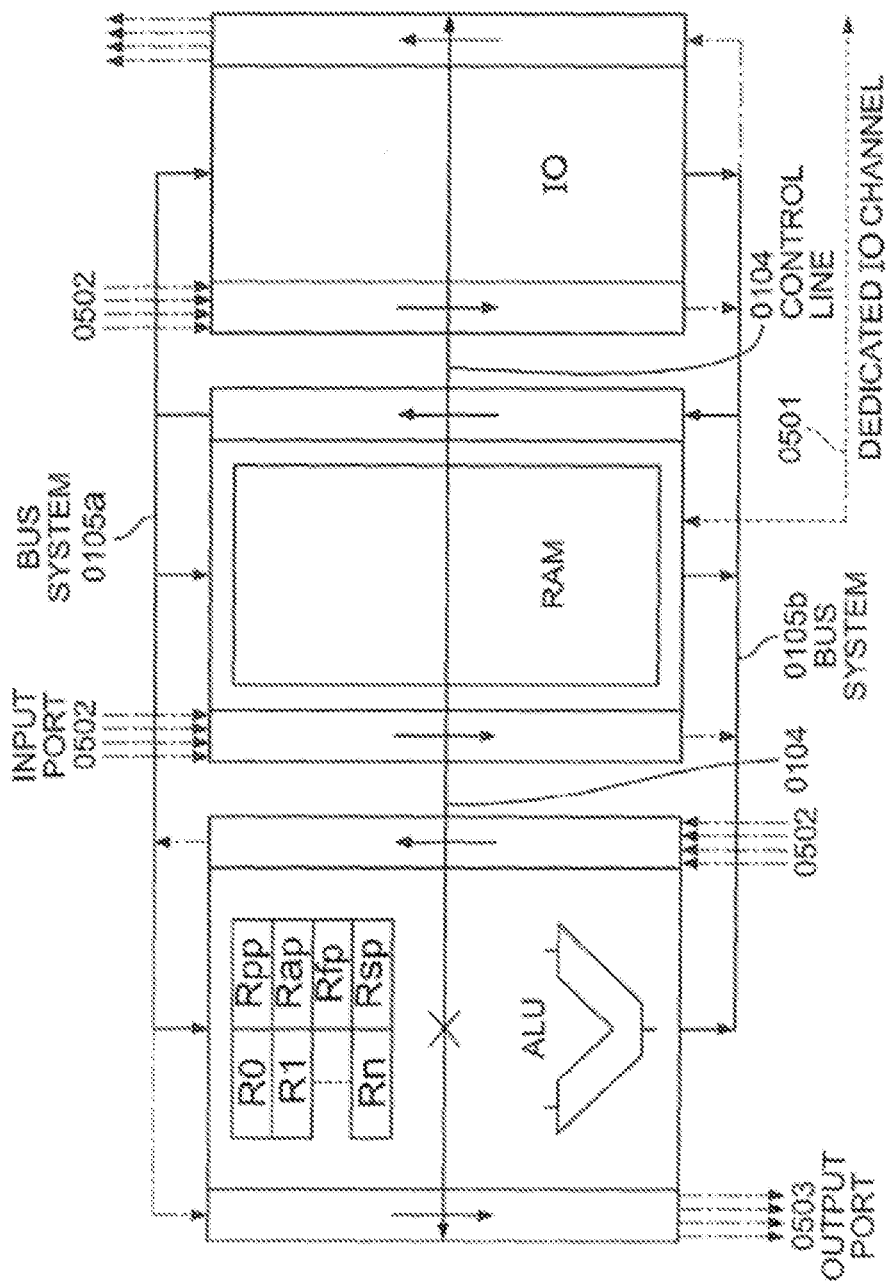

FIG. 5A and FIG. 5B show a variant of the sequencer according to FIG. 3B. The ALU-PAE may have a minimal register set Ra, Rb, Rx which in this example may function only to buffer the operands and results. The actual register set may be in the RAM-PAE (RO . . . Rn). Likewise the following registers may be within the RAM-PAE:
Rpp: Program pointer;
Rap: Address pointer for data accesses (e.g., heap);
Rap: Stack pointer for stack accesses; and
Rfp: Frame pointer for securing the stack pointer in subprogram calls.

The CMD bus may be controlled by the ALU-PAE and may transmit the sequence information of the sequencer to all participating PAEs, as well as FREG and BREG for controlling the data transmission on the bus systems (0105*a*, 0105*b*). In this embodiment, the RAM-PAE may have a dedicated 10 channel (0501) via which it may also be able to transmit data, if necessary even independently (e.g., via DMA controller) from or to peripheral units (e.g., 10, memories). The ALU-PAEs may also have such a dedicated connection or in another design variant, the ALU-PAEs, could have such a connection instead of the RAM-PAEs.

Optionally, one or more data exchange devices may be implemented with the remaining cells of the PAs (e.g., function cells and/or memory cells). Data may be read by the PA via input ports (0502) and data may be exchanged via output ports (0503). The ports may be triggered, for example, via the CMD control instructions read_port and write_port and switch the bus systems accordingly. With the control instructions, a selector may be transmitted, indicating which port is addressed by the control instruction.

The position of the register disclosed in the present case within the RAM-PAE may be unusual but may offer two considerable advantages:
a) memory cells may be used for the registers; and
b) the pointers may be directly in the RAM-PAE, so that data access to the memory is particularly rapid. Furthermore, only one bus on bus system 0105 may be necessary for all memory accesses, so the address bus which is normally also necessary may be omitted because the addresses are given locally in the RAM-PAE by the pointers.

For all data transfers, the position of the registers should be noted. In order to implement the simplest possible instructions in the sequencer, instructions for register manipulation may therefore be provided in particular as follows:
moveta Rrr: Loads register Rrr (rr {1 . . . n, sp, pp, fp, ap}) to Ra;
movetb Rrr: Loads register Rrr to Rb; and
movefx Rrr: Writes register Rx to Rrr.

To preserve the data flow character of the ALU, another special OpCode may be implemented: feed: transmits data from Ra/Rb to Rx without manipulating it.

The following examples illustrate an operation of the sequencer:
Add register R1 to register R2 and write the result into register R2:
   moveta R1; movetb R2; add; movefx R2;
Shift register R4 to register R7:
   moveta R4; feed; movefx R7;
Transfer R5 onto stack:
   moveta R5; feed; push (push transfers data of register Rx to the memory location to which Rsp points and decrements (or increments) Rsp);
Set address pointer Rap with the indirect address R4 added to R7:
   moveta R4; movetb R7; add; movefx Ra;
Load data for memory location Rap to R1:
   load; feed; movefx R1 (load transfers data from the memory location to which Rap points to Ra).

The data registers may be situated within the memory of the RAM-PAE, e.g., from address 0x0 to 0x7 (for n=7). Registers may be addressed, for example, by also transmitting the register numbers when the corresponding CMD control instruction (e.g., readJeg, writeJeg) occurs, transmitting these as the address to the memory and filling the high address bits with 0.

The starting address for the code would then be, for example, 0x8 (i.e., 0x(n+1)), whereupon the program pointer Rpp would point to a reset. Instead of being stored in the memory, the address pointers may be stored instead in registers implemented separatciy in order to permit their rapid and simple forwarding to the address lines of the memory.

FIG. 5B shows an architecture of one example embodiment of the present invention having a register set inside the ALU-PAE. This may eliminate the complex register transfer operations, so this embodiment may also result in much faster data processing. However, the hardware cost may be higher because the register set is additionally implemented and the addresses are transferred from the ALU-PAE to the RAM-PAE for all memory accesses.

RAMoverPAE

The special design of an ALU-PAE described below (hereinafter referred to as ROP-PAE) may be particularly suitable for VPUs whose applications have irregular sequential codes that access small volumes of data in a largely unordered sequence.

For implementation of this function, a memory may be integrated into an ALU-PAE (integrated RAM=IRAM) to which the ALU has direct read/write access. The ALU may be accordingly expanded by an address management circuit. Therefore, PAEs according to the design described above (1PAEs) may be used in particular, the separate RRAM being omitted if necessary and replaced by the integrated IRAM or the RRAM being provided more or less as a memory expansion in addition to the internal IRAM.

In one example embodiment, a sequencer and/or microcontroller having a, e.g., limited but complete, instruction set (cf. ARC microprocessor) may be integrated into the ROP-PAE, thus permitting processing of sequential codes. In another example embodiment, the function and sequence performance of the sequencer may also be designed to be configurable (as is known in the related art, for example, through EPS448 from Altera [ALTERA Data book 1993]). The sequencer/microcontroller may be able to respond to states (e.g., status signals, events) in the ROP-PAE and/or states (e.g., including triggers) of other PAEs connected to ROP-PAE (e.g., via bus system).

The sequencer/microcontroller may read its program instructions out of the IRAM. Accesses to the bus system of the array (PA) may correspond to the usual PAEs as may the generation, reception, and forwarding of status signals (trigger according to PACT08). Multiple bus connections for data inputs and trigger inputs and for data outputs and trigger outputs may be provided.

The ROP-PAE is able to read operands from the bus, process them in multiple cycles if necessary and write the result back to the bus.

In one example embodiment of the present invention, a register set may be integrated into the ROP-PAE. In one embodiment, the register set may be organized as a stack like the register set of transputers. This may make it possible to keep the register set particularly small and efficient in terms of hardware technology (typically three registers A, B and C are sufficient).

In addition, it is known from transputer technology that compilers are able to work efficiently with such an inexpensive register set in terms of hardware technology. Likewise, the register set may optionally be implemented in the RRAM.

In one example embodiment of the present invention, the ROP-PAE may have a direct connection (EXTBUS) to an external RAM and/or an external IO. Depending on the application, multiple EXTBUS devices may be provided. In one example embodiment, the EXTBUS may be implemented via an optionally dedicated connection of the PAE bus system to an interface module (1OAG) such as that known from DE 196 54 595.1-53 or DE 102 06 653.1. The memories (RAM) and/or peripherals (TO) may be triggered via the interface module.

In one example embodiment, the ROP-PAE and, in one embodiment, the 1RAM may generate addresses directly automatically for the external RAM, the external 10, and/or other internal memories (RRAM/1RAM) and may automatically control external or internal data transfers. This function may be implemented by independent address generators implemented in the RRAM. For example, DMA controllers arc particularly suitable for this function in that they copy data in blocks between the memories. The address space of the data to be read and the target address space may be set accordingly and the copy operation may be started. The setting may be accomplished through the IPAE. In a design that is more complex in terms of hardware, this function may be implemented by a memory management unit (MMU), whose mode of operation is defined and known in the related art. In summary, an MMU may function as follows:

The RRAM memory managed by the MMU may be divided into multiple pages. Each page may contain data of a virtual memory space within an external memory. For example, the hexadecimal RRAM addresses 0x0a00 . . . 0x0aff may contain data of the external memory at the addresses 0xbd13200 . . . 0xbd132ff. To manage the address conversion, an address translation unit may be used, e.g., implemented in the form of lookup tables. The function of an MFU is in particular to translate a large storage space into a much smaller storage space (in this case the RRAM). This may be carried out by copying pages as needed from the large memory space into the small memory space. As soon as a page is no longer needed, it may be deleted and/or overwritten. If the data on the page has been altered, the page may be written back into the large memory space before being deleted/overwritten. The address conversion unit may operate in such a way that a high part of the physical address (i.e., the address of the page) is stored in the lookup memory and points to the corresponding data on that page in the RRAM as soon as the page is available within the small memory (RRAM). This may allow access to the page. If the page is not present in the RRAM, entry of a reference may be omitted. In this case, the page may first be copied from the large (external) memory space into the RRAM. To do so, another page, e.g., one not currently being used, may be overwritten according to the procedure described above.

The copying may be performed automatically, i.e., without any significant involvement by the sequencer, in that a DMA controller may be triggered by the MMU. The corresponding page addresses in the RRAM and external RAM may be made available by the MMU, as may be the page size (e.g., they are entered into registers).

The ROP-PAE may have a connection to a configuration unit which configures and reconfigures the ROP-PAE according to the usual method. In an example embodiment, the CT may have read and/or write access to the 1RAM in order to manage data and/or code for the sequencer in the 1RAM.

In one example embodiment, the ROP-PAE may automatically load code for the sequencer out of the external RAM via the PA bus system and/or the EXTBUS.

In an example embodiment of the present invention, the 1RAM may be subdivided into multiple segments which may be in different address areas. The segments may be divided for some of the following functions, for example: sequence memory, stack (e.g., for register set), data memory, heap, IO buffer, buffer to external RAM, i.e., cache, lookup tables, configurations for PAEs and/or buses, and the register set of the ROP-PAE.

Depending on the function, the following triggering mechanisms may be provided for this purpose:
sequencer memory/code memory: program pointer to the corresponding memory locations (Rpp);
Stack: stack pointers to the top memory location in the stack (Rsp), optionally also a frame pointer (Rfp), such as that known in the related art (e.g., Intel Pentium);
Configurations for PAEs and/or buses: a pointer within the CT and/or, depending on the implementation, a pointer within the configuration control of the PAE may point to them; and
Register set of the IPAE: if the register set of the PAE should be accommodated in the memory, it may be addressed directly by the PAE, e.g., using that which are fixedly predetermined by the hardware.

The remaining memory areas such as data memories, buffers, and tables may be constructed by the compiler or programmer. These areas may be addressed by the program to be executed and/or the operating system, and the computations may be performed within the program and/or operating system, if necessary with the help of the register set and the ALU of the sequencer.

In one example embodiment, the IRAM may be implemented completely or partially, as described with the IPAEs, by RAM-PAEs outside of the ROP-PAE. For optionally different segments, different RAM-PAEs may be used.

In an example embodiment, some or all segments may be designed as active memories, i.e., they may have a DMA and/or MMU and may thus be able to copy data independently into or out of their memory from or to other memories or peripheral devices. In particular, they may have the functions of the memories known from DE 199 26 538.0, e.g., FIFO, stack, random access, cache, etc., the function being configurable and/or programmable by the sequencer individually for each segment.

In one embodiment, the IRAM may be designed as a multiport memory which may permit optionally simultaneous read and/or write access by multiple memory access units to the memory contents. Memory access units may include, for example, internal and/or external peripherals, processors, or other PAEs.

In one embodiment, the ROP-PAE may function as a local configuration unit, optionally also as a global configuration unit like a CT for ROP-PAEs in the environment or it may also fulfill this function. The ROP-PAE may operate according to the method known from DE 196 54 846.2-53 in use as a local configuration unit. If the ROP-PAE is used as a global configuration unit or if it has a great many local PAEs to configure, then the method according to DE 196 54 593.5-53 may be used. This method has a FILMO functionality and therefore is capable of managing a great many independent configurations. The ROP-PAE may address configurations in the 1RAM, controlled by the sequencer/microcontroller, and configure them to PAEs and/or itself and/or determine the sequence of the sequencer microcontroller. Synchronization using a higher-level configuration unit (e.g., CT or other PAEs) may take place here like the known inter-CT protocols (DE 198 07 872.2, DE 100 28 397.7, DE 199 26 538.0). The ROP-PAE may load configurations via one of the EXT RAM interfaces itself and/or may request configurations from a higher-level configuration unit via the CT interface. The mode of operation may be similar to that of the reconfiguration unit in DE 196 54 846.2-53.

In summary, the basic operation of a ROP-PAE is similar to that of a microcontroller system whose bus connection and/or data transfer and/or program sequence correspond to those of a VPU system. In other words, this is a multiprocessor array in which the bus system is based on the principle of the VPU architecture. The individual processors may be managed by a higher-level control unit (CT). The data transfer may be self-synchronizing via RDY/ACK protocols of the bus systems. The shared processor status, which may be represented by the trigger bus system and may represent the status of a set of processors which may be exchanged among the processors for sequence control, may be regarded as being a particularly essential aspect. Reference is made in this regard to DE 197 04 728.9, DE 101 39 170.6 and DE 101 29 237.6-53.

Likewise, embodiments of the present invention may provide ROP-PAEs which have, in addition to their connection to the internal bus systems of the array of PAEs, a dedicated connection (IO channel) to a supraregional bus system which transmits data in particular over long distances within the array and/or in particular has a direct connection to the peripherals. The connection to the peripherals may be direct, e.g., in that the bus system already corresponds to the peripheral protocol or may take place via corresponding protocol converters for protocol conversion. The dedicated bus system may already correspond to an industry standard (e.g., PCI, RapidIO, Firewire, USB, Ethernet, RAMBUS, DDR-RAM, etc.) to thus permit a simple and uncomplicated connection to the peripheral devices. If necessary, protocol conversions may also be performed in IOAGs connected in between (see DE 196 54 595.1-53) so that an internal simplified and optionally proprietary bus protocol is translated to one or more more complex external standard protocols. It should be pointed out in particular that the term peripherals is also understood to refer to memories, as illustrated with the bus protocols already listed.

It is likewise particularly relevant according to the present invention that PAEs may also have multiple connections to dedicated bus systems.

In addition, depending on the application, expedient architectures may be those in which only a subset of the PAEs has connections to a dedicated bus system or different PAEs having a different number of connections to dedicated bus systems, optionally also different bus systems.

The structure described here may be implemented particularly efficiently, in an example embodiment of the present invention, by expanded and improved semiconductor manufacturing methods and structures in that the memory may be situated on the physical chip spatially above or below the logic functions (ALU, control, buses, etc.) of the PAE. For this purpose, one or more additional levels of semiconductor structure (transistor structures) that may be used for additional functions may be applied over the first semiconductor structure (e.g., silicon) which is known from the related art and the transistor structures constructed therewith, these additional structures being usable for additional functions. For example, in a first level the logic and gates of the PAE function may be implemented and in another additional level the memory functions may be implemented.

In one example embodiment of the present invention, the individual semiconductor layers may be separated from one another by an insulation layer. The insulation layer may have feedthroughs (vias) for transmitting signals between the individual semiconductor layers.

The wiring structure may be implemented in different ways depending on the application. For example, wiring levels and/or one global wiring level assigned to all the semiconductor layers may be provided directly above each semiconductor layer.

To obtain an economical yield, it is necessary to ensure that the overall circuit, i.e., all the semiconductor structural levels together achieve a sufficiently high yield. In addition, it is noted that the electric power consumption, i. e., the power loss of all semiconductor structure levels together should remain within an acceptable range which does not result in overheating and the resulting failure of the circuit. The corresponding requirements may be met through a suitable combination of the function units of the individual semiconductor levels.

For example, for the proposed architecture, a level of logic semiconductor structures may be provided and another level of memory semiconductor structures that are suitable for these requirements may be provided. Although the irregular and less redundant logic semiconductor structures may have a comparatively high error rate and a high power loss, memory semiconductor structures may be implemented in a comparatively redundant manner to have a lower error rate and, by using suitable memory methods (e.g., DRAM), they may also be implemented to have a low power loss. Reference is made explicitly to the fact that it is possible to provide fields in which not all memory locations and/or all logic semiconductor structures are fully functional. It is necessary only to ensure minimum requirements and/or proper management. Redundancies may be considered separately for the two structures.

The multiple semiconductor structures may be stacked one above the other in multiples according to various methods. In addition to the method of applying another semiconductor level above an insulation layer as already described above, which may be accomplished by vapor deposition and/or crystal deposition, for example, thermal or mechanical connections are also possible by soldering or gluing the silicon structure that is to be applied, for example. Suitable methods of soldering also include those known from technologies for joining semiconductor chips to capsules. These include for example reflow soldering and thermo compression. In principle, the simple mechanical joining methods are possible, in which case the wiring may then be accomplished by wire bond, for example. The prerequisite for this is that the silicon structures is to have different sizes so that the wires may be wired from one silicon structure surface to the next and the number of connections should be comparatively low in order for them to be implementable via the wire bond technique.

To optimize the yield, the redundancy method according to DE 197 57 200.6-33 may be used in particular. It should be pointed out that the method according to DE 197 57 200.6-33 may be provided for all PAEs, in other words for both ALU-PAEs and RAM-PAEs, for example. In other words, the redundancy method described in DE 197 57 200.6-33 may be used for all PAEs. The text methods there are also implementable. For PAEs having mainly fine-grained structures, e.g., memories (RAM-PAEs) or FPGAs, it may be advantageous to provide these fine-grained structures with a similarly fine-grained redundancy, i. e., not or not only providing the RAM-PAE or a PAE having an FPGA structure with a redundant PAE but instead or also providing the fine-grained structure itself with redundancy. This means that redundant memory cells (i.e., FPGA cells) may be assigned to the memory cells (and/or FPGA cells), for example. The connections (lines, buses, etc.) between the particular cells may then be adapted to the requirements of a redundant structure accordingly. The design of redundant structures for fine-grained cells such as memories or FPGAs is already known from the related art, for example. Reference is made thereto for an understanding of design details.

The power loss may be reduced greatly by the methods of DE 196 51 075.9-53 and DE 101 35 210.7-53, thus permitting very high integration densities.

It is pointed out that the number of semiconductor structures stacked one above the other is by no means limited to two. With advancing technological development and optimization, an increasing number of levels stacked one above the other, even a very large number, is feasible.

The division of levels must not be limited to an ALU memory division either in the case of a two-layer structure or a multilayer structure. Even with two-layer structures, the memory may be installed together with the ALUs in one layer and to use the other layer completely for the bus systems or the bus systems and IO triggers (IOAGs). The bus systems may also contain the switching elements (multiplexers, transmission gates, etc.) and/or amplifier elements (drivers, etc.) and/or synchronization elements (RDY/ACK control), each of which may require semiconductor structures for implementation.

In addition, it may be expedient to provide a level for the configuration memories and/or configuration registers and/or CTs and their memories.

Figure 6:
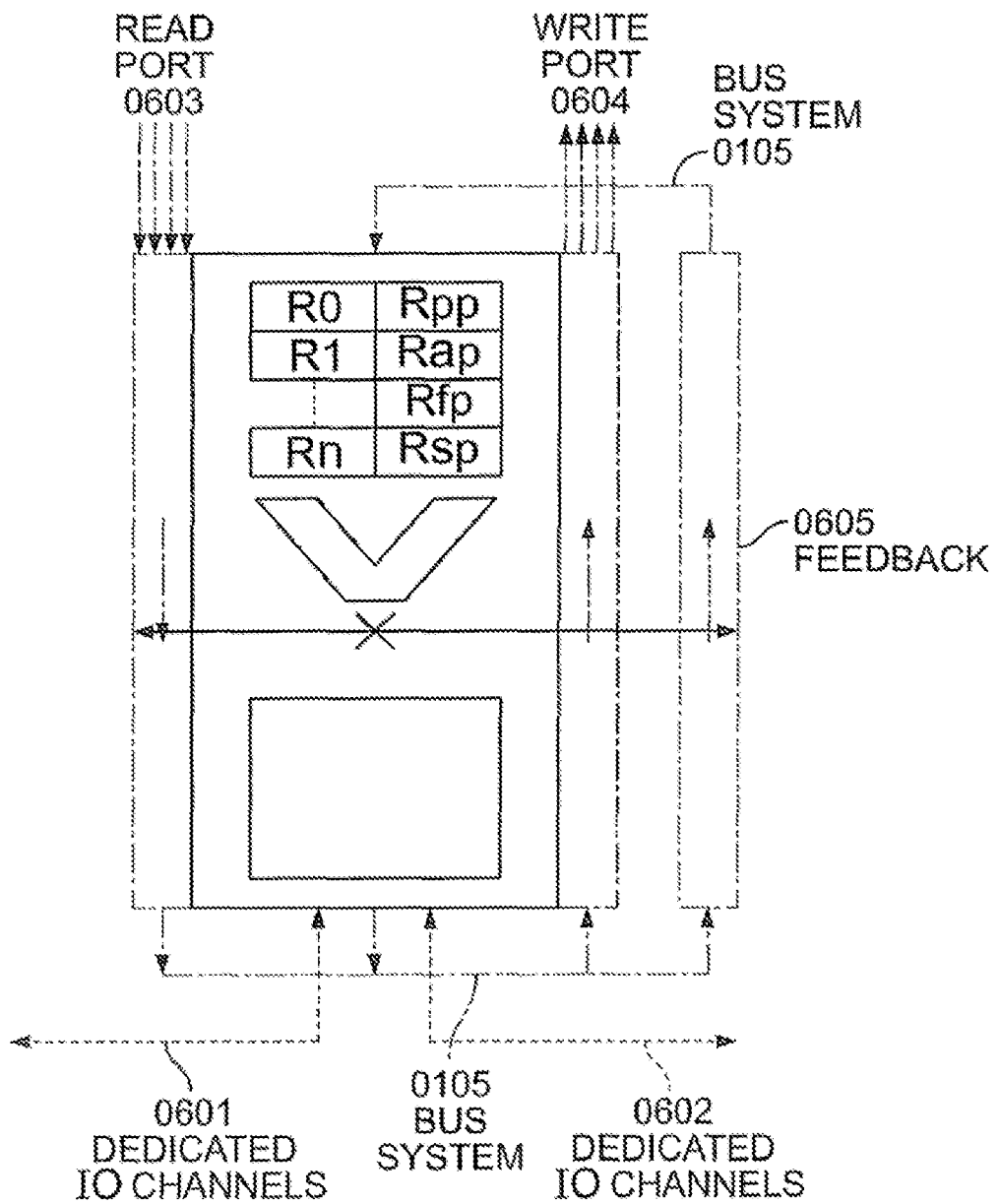
FIG. 6 is a diagram that illustrates implementation of a ROP-PAE, according to an example embodiment of the present invention.

FIG. 6 shows an implementation of a ROP-PAE, according to an example embodiment of the present invention. Architectonically, the RAM-PAE is shows to be implemented within the ALU-PAE. The entire register set (R0 . . . Rn, Rpp, Rsp, Rfp, Rap) is shown to be situated in the ROP-PAE. Access to the registers through the ALU may be possible quickly and using few resources. Addresses and data may be transmitted directly from the ALU to the memory without requiring a bus system outside of the ROP-PAE such as 0105. A ROP-PAE may have one or more dedicated 10 channels for data transmission with the peripherals (e.g., 0601, 0602). Data connections to the remaining PAEs may be implemented through FREG and BREG, as is already known, indicated here by read port 0603 and write port 0604.

ROP-PAEs may be designed internally as sequencers and may thus already have an internal feedback of the ALU output to the registers. Optionally, this may also be accomplished by using a bus (e.g., 0105) external to the ROP-PAE and/or using a feedback through a BREG, as is already known (0605).

FIG. 7 shows various design variants of semiconductor stacks. FIG. 7A shows a design using wire bond connections for data transmission (0701) where two dice (0702, 0703), i.e., two chips, are mounted one above the other. In its simplified form, a chip may have a semiconductor level for implementation of transistors (e.g., silicon, 0704), multiple metal layers for implementation of connecting lines (for example, aluminum and/or copper; three layers are shown here 0705a, b, c), each separated by an insulation layer from the others and isolated electrically from 0704, and an upper high-resistance insulation layer 0706. Feedthroughs made of metal, also known as vias, may be inserted into the insulation layers for electrically connecting the individual levels.

FIG. 7B shows the two dice connected to one another by a type of flip-chip technology, signals being transmitted through "bumps" according to the related art. In addition to the possibilities of connecting bumps (0711), which is provided by the flip-chip technology, to the top metal layer in each case, the particular inventive design whereby the bumps are contacted beneath the semiconductor layer (e.g., silicon) is also presented here. To do so, electric connections (e.g., aluminum or copper), i.e., vias (0712) may run downward through the silicon layer. This may be formed by etching appropriate holes into the semiconductor level. An insulation may be inserted between the connections and the semiconductor layer. The feedthrough may be accomplished as indicated in FIG. 7D either directly through the semiconductor layer or first troughs (0731) may be etched into the semiconductor layer and then filled with insulation into which the vias may then be introduced.

FIG. 7C shows an example embodiment for implementation of semiconductor stacks. Above the top insulation layer (0721) of a first semiconductor structure, which in this case may be thinner, another semiconductor level (0722) may be applied. To do so, the insulation layer (0722) may be first made as planar as possible by etching and/or grinding. The semiconductor may be applied by vapor deposition, crystal deposition, or by gluing or glue-like joints. It may be essential, particularly when using glued joints, to be able to etch through the applied semiconductor structure and the joining material (e.g., adhesive material). This through-etching may be necessary to be able to run contacts as described in conjunction with FIG. 7B to the vias in the insulating layer beneath them.

The feedthrough of the contacts may be accomplished according to FIG. 7D, e.g., by etching narrow channels into which an insulation material is introduced. Then, in a second step, a narrower via may be inserted into the insulation material, e.g., by first creating a hole of a corresponding diameter, e.g., by etching in the insulation material.

According to a method of one example embodiment, larger troughs (0731) may be etched and filled with insulation material. Then, if necessary, multiple vias (0712) may be introduced into the troughs as described above.

FIGS. 7D, F, G, H show different functional divisions of such semiconductor stacks. The semiconductor level is shown with hatching in each case and the insulation layer is shown with a thick boundary. The metal layer is inserted between them. As indicated in FIGS. 7G and 7H, the construction is not limited to two stacks; likewise larger stacks, e.g., with three, four, or more levels, are also possible.

Figure 7E:
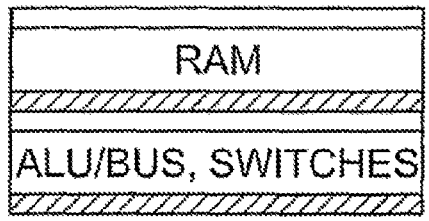

The separation between the memories and ALUs which have already been depicted repeatedly is shown in FIG. 7E.

Figure 7F:
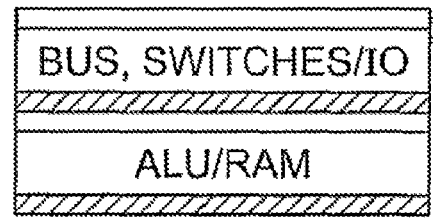

FIG. 7F shows the separation of buses with the necessary switching units and the IO structure from the ALUs and memories which in this example are situated in the same plane.

Figure 7G:
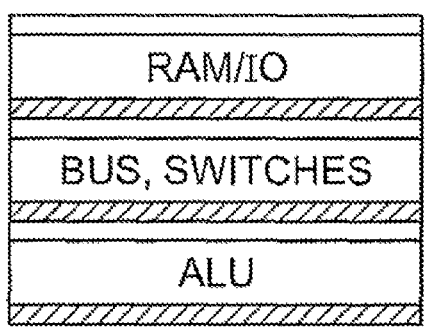
Figure 7H:
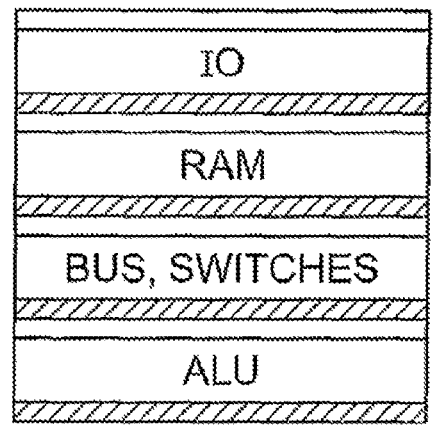

In FIG. 7G, the ALUs are located on the bottom level. The memories and optionally the drivers of the IOs are on the top level. Thus, the structures having a high power loss are situated at the outer edges of the stack. This may be provided in one example of the present invention, in particular because it may permit particularly optimal heat dissipation. The bus systems and their switching units are shown to be situated in the middle level.

In the example of FIG. 7H, buses and memories having a low power loss are accommodated in the middle levels. ALUs and the IOs which have a particularly high power consumption are accommodated at the edges for optimum heat dissipation.

IOx-PAEs

DE 199 26 538.0 describes memories (IORAM-PAEs) having a dedicated connection to external units such as peripherals and/or memories. In addition, DE 196 54 595.1-53 and DE 102 06 653.1 describe dedicated units (e.g., interface modules (IBGs)) for connecting external units such as peripherals and/or memories. Both methods have the problem that additional complexity is required for data communication between PAEs, in particular data processing and/or data computing PAEs and external units because the data must be transmitted explicitly between the PAEs and IBGs and/or IORAM-PAEs.

In an embodiment of the present invention, as already mentioned above repeatedly, one or more dedicated connections (TO channels) may be provided to external units such as peripherals and/or memories for any PAEs, but in particular for data processing PAEs and/or data computing PAEs (e.g., ALU-PAEs according to DE 196 51 075.9-53, IPAEs, ROP-PAEs) and data storing PAEs (RAM-PAEs according to DE 100 50 442.6). This may permit direct communication among PAEs, referred to below as IOx-PAEs, and external units. An advantage of this architecture is that the connection of the array of PAEs (PA) to the peripherals (external memory and/or IO units) may be constructed much more efficiently. The existing configurable bus systems of the PAEs among one another (BUS) need not be burdened with the IO data transfers. Furthermore, with a suitable design of the IO channel, addressing of individual PAEs or addressing of the data for individual PAEs may be performed much more easily than would be the case via the bus. This may be implemented by each unit connected to an IO channel having its own unique address. With this address, each unit may be addressed explicitly and easily by transmitting the address over the IO channel and each unit comparing this address with its own. If the addresses match, the unit is being addressed and the data is intended for this unit. Each unit may transmit, not only the destination address, i.e., the address of the unit for which the data is intended, but also its own address in order to permit identification of the sender.

It may be particularly efficient to provide IO channels for only a subset of all of the PAEs. For example, it is possible to provide only strips of PAEs with IO channel expansion within a PAE array (PA). This may yield an improved area efficiency and cost efficiency in comparison with implementation of the IO channel expansion in all PAEs.

PAEs which have particularly high communication requirements may also be connected to several IO channels, depending on the application.

The dedicated IO channels may be implemented on different bus systems, e.g., in particular according to DE 197 04 742.4 or as a parallel standard bus system such as Rapid IO, PCI, AMBA, or serial standard bus systems such as USB, Firewire or Ethernet.

The implementation of IO channels in PAEs may be particularly efficient if they are not connected directly to the external units but instead are first connected to an IO management unit (IOAG) which may be designed like the protocol converter according to DE 102 06 653.1 or the IOAG according to DE 196 54 595.1-53. The advantage is that a simple internal bus protocol may then be used to control the IO channels. Likewise, only a little "intelligence" is required in each PAE having an IO channel, so that the PAEs may be small in terms of surface area and are not complicated to program.

The actual management and triggering of the external units may be handled in the IOAGs which may be designed to be much larger and more complex.

The IOAGs may themselves have their own sequencer and/or microcontroller and, if necessary, also their own memory to fulfill their function. In particular, the IOAG may also have memory management units and address translation units. Depending on the application, interrupt controllers such as that known according to the related art (i8259) may also be implemented in the IOAG, translating interrupts to trigger signals according to DE 19704728.9.

STMD PAEs

Using reconfigurable technologies for processing algorithms results in an important paradox: (1) complex ALUs are necessary to achieve the highest possible computation performance, but the complexity for the reconfiguration should be minimal; (2) the ALUs should be as simple fine-grained as possible to permit efficient data processing on a bit level; (3) the reconfiguration and data management should be accomplished so intelligently and rapidly that they are easy and efficient to program. Previous technologies have used either a) very small ALUs having little reconfiguration support (FP-GAs) which are efficient on a bit level or b) large ALUs (Chameleon) having little reconfiguration support or c) a mixture of large ALUs and small ALUs having reconfiguration support and data management (VPUs).

The VPU technology being the most efficient technique, an embodiment of the present invention may provide an optimized method created on the basis thereof. It is pointed out that this method may also be used for the other architectures. The surface area required for efficient control of reconfigurations may be comparatively high with approximately 10,000 to 40,000 gates per PAE. Below this gate level, as a rule, it is possible to implement only simple sequence controls which greatly restrict the programmability of VPUs and make it difficult to use them as general purpose processors. If the goal is a particularly rapid reconfiguration, additional memories may be provided so the required number of gates is greatly increased again.

To obtain a proper ratio between reconfiguration resources and computation performance, large ALUs (many functionalities and/or large bit width) may be used. However, if the ALUs become too large, the usable parallel computation power per chip drops. If the ALUs are too small (e.g., 4 bit) then the use of resources required for configuration of complex functions (e.g., 32 bit multiplication) is too high. In particular, the wiring complexity increases into ranges that are no longer reasonable commercially.

SIMD Arithmetic Units

To obtain an ideal ratio between the processing of small bit widths, wiring complexity, and configuration of complex functions, SIMD arithmetic units within ALU-PAE (i.e., in particular the PAEs disclosed in the present application according to the present invention, as well as in PAEs according to DE 196 51 075.9-53 and DE 199 26 538.0) may be used. Arithmetic units of width m may be divided in such a way as to yield n individual blocks of width b=m/n. Through configuration, it may be specified for each arithmetic unit whether the arithmetic unit is to be broken down into one or more blocks and whether they should be of the same width or different widths. In other words, an arithmetic unit may also be broken down in such a way that different word widths are configured at the same time within an arithmetic unit (e.g., 32-bit width, broken down into 1×16, 1×8, and 2×4 bits). The data may be transmitted among the PAEs in such a way that the data words that have been broken down (STMD-WORD) are combined into data words of bit width m and transmitted as a packet over the network.

The network may always transmit a complete packet, i.e., all data words within a packet, e.g., according to the known handshake method. Individual data words within the packet may also remain unused, i. e., they may not contain any information. This may be implemented through additional status lines and/or handshake signals such as the RDY/ACK protocol.

SIMD Bus Systems

For efficient use of STMD arithmetic units, flexible and efficient re-sorting of the SIMD-WORDs may be necessary within a bus or between two different buses.

Figure 12A:
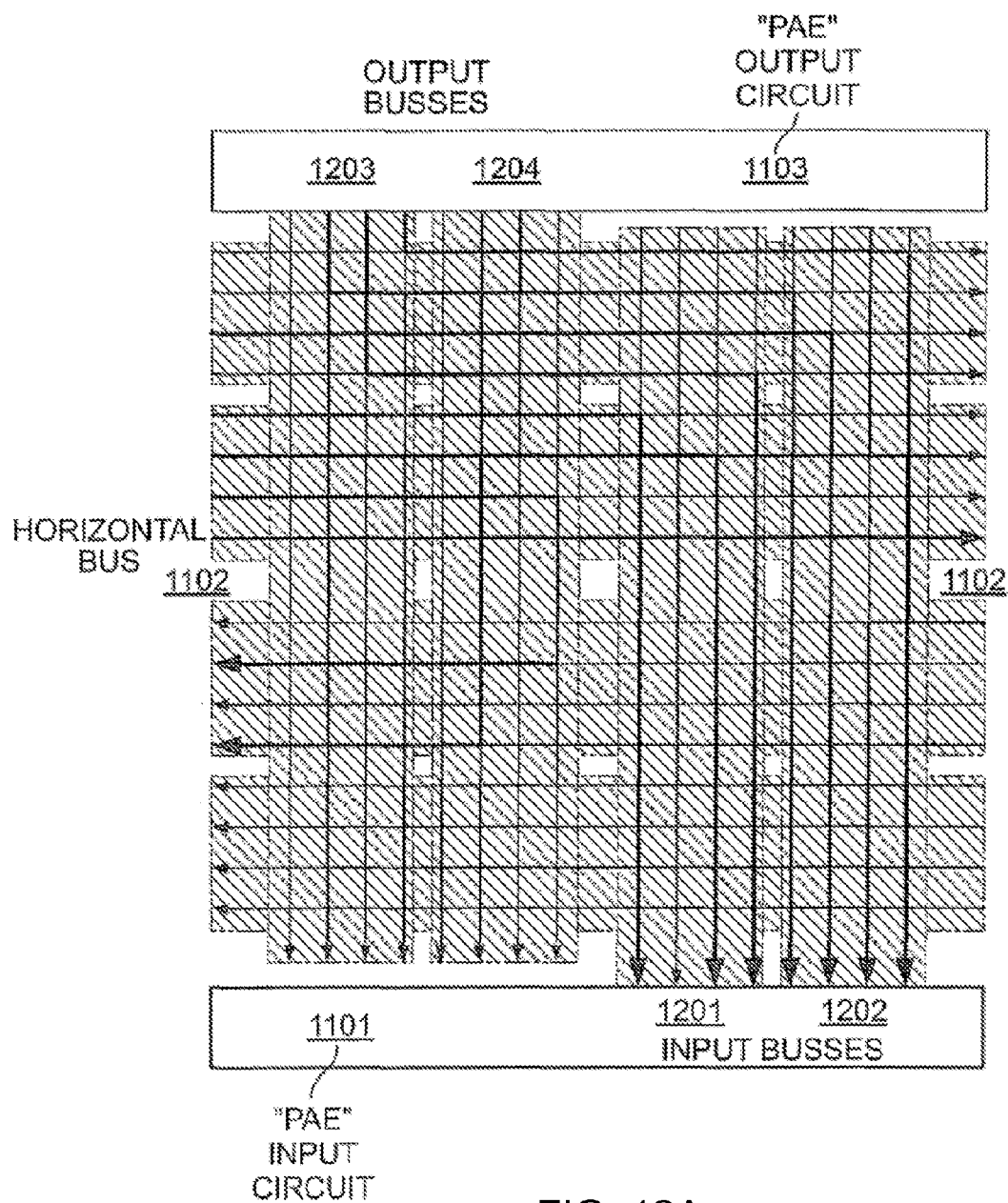
FIG. 12A to FIG. 12C are diagrams that illustrates buses in a matrix structure, according to example embodiments of the present invention.

The bus switches according to FIG. 11 (A-D) may be modified in such a way that a flexible interconnection of the individual SIMD-WORDs is possible. To do so, the buses may be designed to be divisible by multiplexers, bus switches, transmission gates, pass transistors (hereinafter referred by the collective term multiplexer), for example, according to the arithmetic units so that the division may be determined by the configuration. In other words, instead of using a multiplexer of width m per bus, for example, n individual multiplexers of width b=m/n may be used. It is now possible to configure the data buses for a width of b bits. Re-sorting of the data is also possible due to the matrix structure of the buses (FIG. 11 (A-D)) as depicted in FIG. 12A.

The handshakes of the buses may be logically gated in such a way that a common handshake for the newly organized bus is generated from the handshakes of the original buses. For example, a RDY may be generated for a newly sorted bus from a logic AND gate of all RDYs of the buses supplying data for this bus. Likewise, for example, the ACK of a bus supplying data may be generated from an AND gate of the ACKs of all buses which process the data further. In principle, with this implementation suitable gates may be selected so that they correspond to the bus protocols used in each case.

In a first embodiment, the handshakes may be gated within each bus node. This makes it possible to assign only one handshake protocol to a bus system of width m composed of n subbuses of the width b.

In another embodiment, all the bus systems may be designed with a width b which corresponds to the smallest implementable input/output data width b of a SIMD-WORD. According to the width of the PAE data paths (m) there is now an input/output bus of m/b=n subbuses of width b. For example, a PAE having three 32-bit input buses and two 32-bit output buses actually has 3×4 eight-bit input buses and 2×4 eight-bit output buses for a smallest SIMD-WORD width of eight. Each of the subbuses may have all the handshake signals and control signals that are used, e.g., RDY/ACK and the Reconfig trigger according to DE 197 04 728.9 and a global reset signal, etc.

The output of a PAE may send the same control signals for all n subbuses. Incoming acknowledgment signals of all subbuses may be logically gated, e.g., by an AND function. The bus systems may freely switch each sub bus and route it independently. The bus systems and in particular the bus nodes do not process and/or gate the handshake signals of the individual buses independently of their routing, their configuration and sorting.

In the case of data entering a PAE, the control signals of all n sub buses may be gated in such a way as to generate a generally valid control signal more or less as a bus control signal for the data path. For example, in a "dependent" mode of operation RdyHold stages may be used for each individual data path and only when all RdyHold stages signal pending data is the data taken over by the PAE. In an "independent" mode of operation, the data of each subbus may be written independently into input registers of the PAE and acknowledged, so that the sub bus is immediately free for the next data transmission. The presence of all required data from all subbuses in the input registers may be detected within the PAE by a suitable logic gating of the RDY signals stored for each subbus in the input register, whereupon the PAE may begin data processing.

An important advantage of this method is that the S1MD property of PAEs does not have any particular influence on the bus system used. Simply more buses (n) of a lesser width (b) are needed. The interconnection itself may remain unaffected. The PAEs may gate and manage the control lines locally. This may eliminate the additional hardware in the bus systems for management and/or gating of the control lines.

FIG. 11 (A-D) shows a design of a bus structure for VPU architectures, according to an example embodiment of the present invention. The output circuit of a function cell, e.g., (PAE, FREG/BREG) (1103, corresponding to 0803*a, b*) may be connected to the horizontal bus system (1102, corresponding to 0105) via a vertical bus. Similarly, the input circuits of the function cells (1101, corresponding to 0801, 0802) may pick up information from the horizontal bus system via a vertical bus. The figure shows how such a pickup, i.e., such a transfer, may take place. As shown in FIG. 11A, the transfer of an output bus (1111) from 1103 to 1102 may take place through an "isolation" of a bus of the horizontal bus system 1102 and the insertion of horizontal switches (1112) which may be implemented by switches, transmission gates, multiplexers, or similar suitable components. Depending on the value of a decoder and/or configuration bit (indicated by switch symbol 1113) which is situated and configured in a configuration register of the PAE according to the known configuration method, the switch may either connect the two halves of horizontal bus 1102 together or switch bus 1111 up to the one-half of 1102 in which case the other half of 1102 may then be interrupted and not forwarded. This circuit may be used for each bus of the horizontal bus system.

FIG. 11B shows the corresponding circuit for picking up data from 1102 and for forwarding same to 1101. Data may be picked up bit by bit from the buses of the horizontal bus system (1102) and transmitted to input circuit 1101 on the vertical input bus (1121) via vertical switches (1122) which may be implemented by switches, transmission gates, multiplexers, or similar suitable components. The vertical switches, i.e., their switch function, may be triggered by decoders and/or configuration bits (indicated by switch symbols 1123) which may be situated and configured in configuration registers of the PAE according to the known configuration methods. FIG. 11B and, with appropriate modification, also FIG. 11A may allow n:1 data transitions, i.e., multiple buses may be combined into one bus, i.e., the data of multiple buses may be combined on one bus. FIG. 11C shows the bus isolation function of the horizontal VPU bus systems (1102). Each horizontal bus individually and by itself may be isolated from the output side of the PAE edge. Isolation may be accomplished through multiplexers or switches as indicated in FIG. 11C. Depending on configuration bit 1132 which may be available individually for each bus of the bus system, the data transmission onto the adjacent bus system (1131) may be enabled or suppressed. This function may be implemented in the switches according to FIG. 11A in that the information of configuration bit 1132 is transmitted to the switches (1112) of the adjacent bus system (1131) and accordingly the switches may be enabled to forward the information or the switches may be blocked (disabled).

FIG. 12A shows a STMD bus system corresponding to FIG. 11, including a simplified horizontal bus system 1102, a PAE output circuit 1103 and a PAE input circuit 1101. Each input circuit may have, for example, two input buses of the width 32 bits (1201, 1202) and each output circuit may have two corresponding output buses (1203, 1204). Each bus (1201, 1202, 1203, 1204) may be divided into four subbuses of 8 bits each which may be routed differently and independently, as depicted here, while some of the subbuses are not in use (dotted line). The flexible wiring may be achieved by designing the switches according to FIGS. 11 A-C for each bus separately in such a way that one sub bus is managed by one switch having its own configuration. Therefore, the bus system may be wired up in a fine-grained design.

Figure 12B:
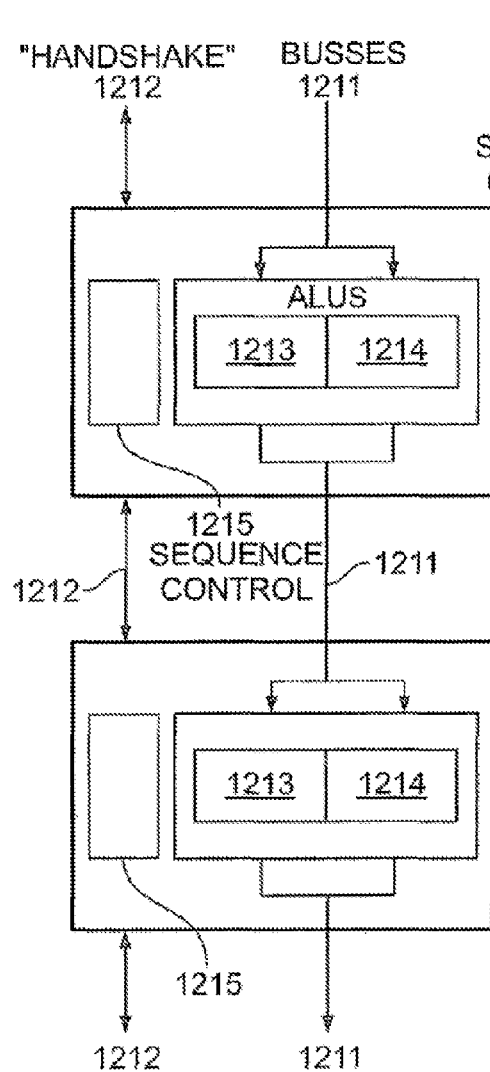

FIG. 12B shows a SIMD data processing in which all buses (1211) have the same handshake (1212). The buses may be divided into subbuses within a PAE and may be processed separately in the SIMD-ALUs (1213, 1214). The shared handshakes may trigger the sequence control (1215) of the PAEs or may be generated thereby.

Figure 12C:
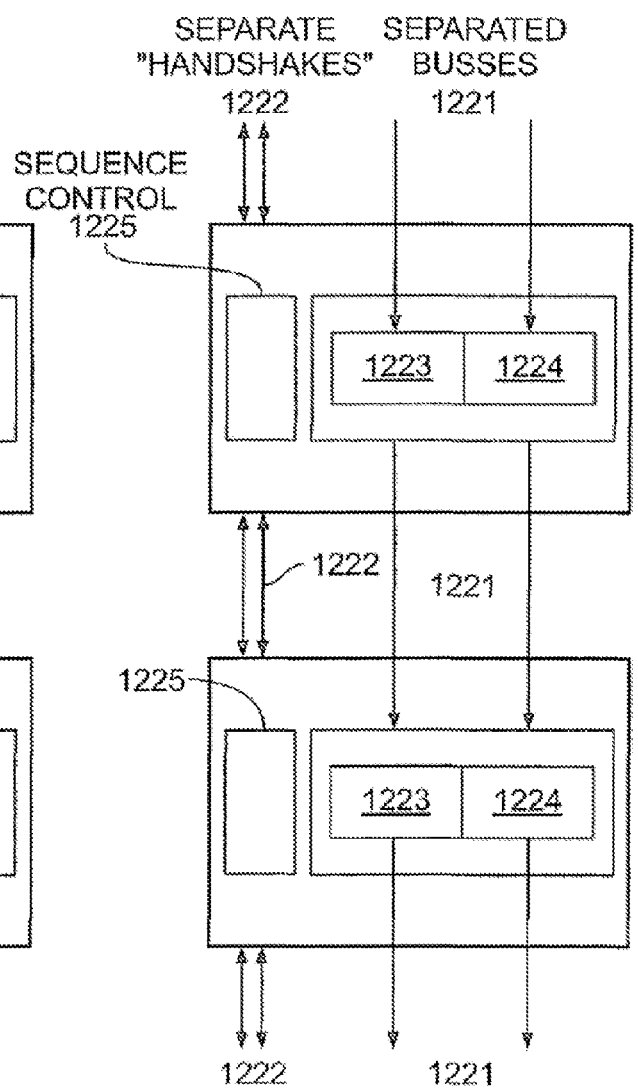

FIG. 12C shows a SIMD data processing in which all buses are completely separated (1221) and have separate handshakes (1222). The buses in the SIMD-ALUs (1223, 1224) may be processed separately. The separate handshakes may trigger the sequence control (1225) of the PAEs or may be generated thereby.

Use of FPGAs as the ALU Core

PACT 13 has already described an architecture in which instead of an ALU, an FPGA or FPGA-like structure is integrated into a PAE. This structure is configured according to the related art within a PAE according to the FPGA configuration methods, i. e., the expanded configuration methods according to PACT02, 04, 05, 10, 13, 17 are not applicable to the FPGA structure. Therefore, the effort and cost for the configuration control of the relatively small FPGA cells are low. However, the PAE, which contains the FPGA cells, behaves according to the VPU configuration method as described in the aforementioned publications. Therefore, the FPGA structure is encapsulated in the PAE structure and behaves like a PAE object having a plurality of configuration registers.

Any operations may therefore also be mapped onto an array of FPGAs. According to DE 101 35 210.7-53, a mixture of ALU-PAEs and PFGA-PAEs within a VPU is possible and quite appropriate. A decision should be made on the basis of the field of application as to whether a multiple set of configuration registers is appropriate for the FPGA cells because the number of cells is very high. If necessary, configuration registers for rapid reconfiguration of an FPGA-PAE according to DE 196 51 075.9-53, DE 199 26 538.0 and in particular DE 100 28 397.7 (FIGS. 18 and 19) may be implemented as register files or a FIFO structure within the PAE and may be loaded from there into the FPGA cells.

In an example embodiment of the present invention, a FPGA structure may be assigned to the ALU within an ALU-PAE by placing the FPGA structure upstream from and/or downstream from and/or in parallel with the ALU. An embodiment in which the FPGA structure is downstream from the ALU may be preferred.

An advantage may be that only relatively small FPGA structures need to be used because all the arithmetic operations are still taking place in the ALU. Therefore, a particularly high performance/cost efficiency may be achieved. To support small word widths (4 bit, 8 bit, etc.), it is particularly advisable to use the SIMD-ALUs described above.

Correlators and PN G generators in particular may be constructed in a particularly efficient manner by connecting FPGA structures downstream from an ALU.

An embodiment of the present invention may provide for the use of VPU architectures in particular for replacement of ASICs for a moderate and low number of parts. This area of application of VPU modules has the special feature that the application fields are very clearly defined and frequently only a few applications are executed on the modules. In particular, these areas of application frequently require fine-grained FPGA structures for bit-by-bit processing of data.

Due to the limitation to a few applications, the possible configurations of the FPGAs here may also be very limited and predictable. It has been found that it is worthwhile in particular for these areas of application, for example, to separate the reconfiguration of the FPGA structures from rapid reconfiguration of the coarse-grained structures. In other words, slower reconfiguration methods (e.g., conventional serial methods) are used for the FPGAs and are implementable in an extremely cost- and surface area-efficient manner.

For this purpose, (1) a completely separate configuration system including a bus system and configuration controllers may be constructed, as is known for FPGAs according to the related art; and (2) the configuration resources of VPU technology may be used but without resources for special accelerating measures being made available. For example, access to the FILMO may be precluded for FPGA structures according to DE 196 54 593.5-53, DE 198 07 872.2. Similarly, the presence of configuration register stacks, according to DE 100 28 397.7 or as described below, may be omitted. Likewise, the support of fast wave reconfiguration according to DE 199 26 538.0, DE 100 28 397.7 may be omitted.

It is possible to assign a PAE to an FPGA array for reconfiguration. In this case, the PAE need only be configured to load the FPGA structure, which may take place as described above through PAE-controlled independent access to data from the outside.

For cost reasons in particular, it may be advisable to provide an embodiment in which "1×configurable" architectures are used instead of multiple reconfigurable architectures because they save on resources. The VPU modules may then be personalized once before being delivered to the customer or at the customer's place and/or by the customer, i.e., the FPGA structures may be configured for their function which is to be performed. The function of the FPGA structures cannot then be modified subsequently, while all the remaining functions such as those of the ALUs and their interconnection continue to be completely run-time configurable in accordance with VPU technology.

In particular the known ROM, EPROM, EEPROM, FLASH-based methods are suggested as "1×configurable" technologies. It should be pointed out in particular that the known fuse and antifuse methods (e.g., Atmel, Actel, Quicklogic) are particularly suitable for implementation of such "1×programmable" FPGA structures.

The basic design of such structures will not be discussed further here because this is sufficiently well known from the relevant related art, in particular the patents by the companies listed above.

FIG. 8 shows as an example a PAE according to an example embodiment of the present invention. The data path of the PAE is shown. The connection to bus system 0105 may be implemented by input modules 0801 and 0802, which may contain registers, and output module 0803, which may also contain registers. Downstream from the ALU (0804) may be a function unit of fine-grained FPGA cells (0805) which may be interconnected via a bus structure. The output of 0804 may be connected to this bus structure and the bus structure may be in turn connected to 0803. Optionally, a bypass of the output of 0804 may be connected directly to output module 0803 bypassing 0805 by using a multiplexer.

Multiple stages of logic may be configured into the FPGA cells, in particular some or all of the following functions: multiplexer, AND, OR, XOR, NOT functions, half-adders, comparators, shift registers, registers, and Boolean lookup tables.

The FPGA cells (0805) may be configured via the configuration bus (0404) of the PAE. Special configuration accelerating modules such as configuration stacks (0406) for configuration of FPGA cells may be omitted. If necessary, these modules may be switched to a passive status for such configuration data or the configuration data may be sent bypassing them.

In one example embodiment, a permanent 1×configuration of the FPGA cells may be provided, using ROM elements such EPROM, EEPROM, Flash ROM or fuse/antifuse technologies.

FIG. 9 shows possible embodiments of PAEs according to the present invention. The embodiment in FIG. 9A and that in FIG. 9B may also be implemented simultaneously together in one PAE.

FIG. 9A shows the connection of a register file (0901) (e.g., R0 . . . Rn) to a core (0902) which may be made up by an ALU such as 0804 or an ALU (0804) and FPGA cells (0805).

The result data of the core may be sent to registers 0901 where it may be stored depending on the operation. Registers 0901 may be connected to the inputs of the ALU via multiplexers (0903,0904), depending on the operation to be performed.

FIG. 9B shows a similar structure in which an additional transfer unit (0901) is implemented for a dedicated global bus (0912) (e.g., IO channel). The result data of the core may be sent to transfer unit 0911 where it may be transmitted to the global dedicated bus (0912) depending on the operation. Data from 0912 intended for the PAE may be sent via multiplexers (0903, 0904) to the inputs of the ALU, depending on the operation to be performed.

Optionally transfer unit 0911 may read data directly from bus system 0105 or transmit data to it via bus transfer units 0913 and 0914.

FIG. 10A shows the use of dedicated global bus systems within an array of PAEs (1001). To this extent this corresponds to the diagram of PAs from FIG. 1 (0101). A set of PAEs (1001) may be connected to global dedicated bus systems 1002, 1003, 1004 and may send data to them or receive data from them. The data may be transmitted between PAEs and between PAEs and Ios. This shows that PAEs may also be connected simultaneously to a plurality of global dedicated bus systems while other PAEs might not have any connection.

FIG. 10B shows, for example, the connection of a global dedicated bus (e.g., 1002, 1003, or 1004), which is connected to a few PAEs (1001) within the array of PAEs (0101), to modules outside of 0101, optionally also external to the component. The modules may be, for example, peripherals (1011) and/or memories (1012). For connection of the modules (1011,1012) on the outside, the signals may be adjusted, if necessary (e.g., voltages: CMOS, TTL, L VDS, etc.).

FIG. 10C shows an example of the connection of a global dedicated bus (e.g., 1002, 1003, or 1004), which is connected within the array of PAEs (0101) to a few PAEs (1001) and then to an interface module (1021). The interface module may translate the protocols and/or signals of the internal dedicated bus onto one or more buses on the outside. In the example shown here, two outside buses (1022, 1023) are implemented. The bus systems may be of different designs, e.g., 1022 may be a memory bus system for memories (1024) such as SDR-RAMs, DDR-RAMs, RAMBUS or the like, while 1023 may be a peripheral bus system for peripheral devices and/or IO devices (1025), e.g., PCI or a serial protocol such as USB, FireWire or Ethernet.

Configuration of Complex Arithmetic Units

Complex arithmetic units (e.g., floating point arithmetic units) may be implemented through suitable wiring and grouping of configurable cells (PAEs), possibly also those of different designs (RAM-PAEs, ALU-PAEs, buses).

For example, a floating point arithmetic unit may be achieved by a suitable connection of a plurality of ALU-PAEs which perform the arithmetic operations via exponent and mantissa. The forward and backward registers (FREG/BREG) integrated into the VPU of the assignee of the present application (XPP technology) may be assigned to the ALU-PAEs to perform the required normalizations by shift operations of the barrel shifters situated in the FREG/BREG. Thus, floating point arithmetic units may be constructed as needed on the basis of the integer ALUs with a high surface area efficiency.

One advantage of this method is that no silicon surface area need be used for fixedly integrated floating point arithmetic units. Since floating point operations are used only rarely in relation to integer operations, this may greatly increase the benefit/cost ratio. Compilers which translate the high level language programs to a VPU may be able to translate corresponding prefabricated complex structures into the machine code (e.g., NML) through macroexpansion and/or by using run-time libraries.

For machine code programs (e.g., NML), library calls to libraries containing the corresponding complex functions in prefabricated form arc particularly recommended.

State Machines Via RAM-PAEs

RAM-PAEs connected to an array of PAEs may be used for constructing sequencers. The basic principle is that output data of a memory may be fed back to its address input. The feedback may take place via a clock pulse-controlled register. This may result in a sequencer whose next cycle is predetermined by the current cycle.

Parts of the output data (CONTROL signals) may then be transmitted to other modules and/or function cells (PAEs) and/or to external devices to trigger certain processes there. Two types of transmission which are usually used together and which may be used in this case are:

a) transmission via a databus, e.g., designed in particular as a STMD bus according to the preceding discussion, so that a partial transmission of the output data is implementable in a particularly efficient manner; and b) transmission via a trigger bus, for which an embodiment and operation are described in PACT08. States and conditions for sequence control of modules and/or function cells (PAEs) and/or external devices may be transmitted particularly efficiently via trigger buses.

The input addresses and/or output data may be constructed as follows (diagram: high bits . . . low bits):
Address:
Address of the current cycle
Data:
Address of the next cycle CONTROL signals The input data is typically not used, i.e., there is only read access to the memory, not write access. The content of the memory (e.g., RAM-PAE) may be pre configured by a configuration unit. Therefore, the memory may also be constructed in particular as a nonvolatile 1×programmable memory using RAM, EPROM, EEPROM or flash cells or based on fuse or antifuse technologies. The memory may then be personalized, i. e., programmed, as described above before delivery to the customer or at the customer's location.

Memory access by other PAEs is fundamentally possible in order to modify the sequencer, e.g., during operation, but further description of this aspect is not included since it not required for an understanding of the present invention.

The sequencer according to an example embodiment of the present invention may respond to events through the following expansions in its sequence of cycles and may perform limited jumps in particular:

A part, e.g., the low portion, of the input addresses to the memory may be used as input for other status signals. These status signals may be transmitted by the types of transmission discussed above and thus may be data or triggers. In the selection of the following cycle, a possible number of cycles may then be determined by the data feedback to the, e.g., high, address bit and the certain cycle may then be selected from the possible number through the status signals of the low address bits.

This may result in the following structure of the input addresses and/or output data (diagram: high bits . . . low bits):
Address:
Address of the current Status signals
cycle
Data:
Address of the next cycle CONTROL signals Thus, a full-value sequencer may be defined which corresponds to the basic principles of the Mealy-Moore sequencers.

The status signals and/or control signals may now be grouped into bundles, if necessary, in such a way that one group of certain transmitters/receivers is available, e.g., a group for 0101-internal PAEs, a group for external modules, and a group for the configuration unit.

In other words, all jumps are implemented by specifying the "address of the next cycle." Conditions may be implemented by the status signals.

With respect to how to handle so-called "don't cares," i.e., certain status signals whose value in a cycle is irrelevant, in an example embodiment of the present invention, the same data may be defined for all possible values.

Example

Within an address having the following structure
Address of the current Status signals
cycle
the "address of the current cycle" (cycle) should be equal to Ox60, for example, corresponding to CYCLE60. Four status signals (ZSO . . . 3) may be provided, two of which (ZS3 and ZS 1) according to the value within the exemplary cycle may lead to other jump destinations, i.e., according to CYCLEIO, CYCLE7, CYCLE89, CYCLE56, for example.

The table is now as follows:

| Address Cycle | ZS3 | ZS2 | ZS1 | ZS0 | Data |
|---|---|---|---|---|---|
| CYCLE60 | 0 | ? | 0 | ? | CYCLE 10 |
| CYCLE60 | 0 | ? | 1 | ? | CYCLE7 |
| CYCLE60 | 1 | ? | 0 | ? | CYCLE89 |
| CYCLE60 | 1 | ? | 1 | ? | CYCLE56 |

The don't cares (ZS2, ZSO) are now occupied, so that the value of their signal has no effect on the assignment of the address to the data:

| Address Cycle | ZS3 | ZS2 | ZSI | ZS0 | Data |
|---|---|---|---|---|---|
| CYCLE60 | 0 | 0 | 0 | 0 | CYCLE10 |
| CYCLE60 | 0 | 0 | 0 | 1 | CYCLE10 |
| CYCLE60 | 0 | 0 | 1 | 0 | CYCLE7 |
| CYCLE60 | 0 | 0 | 1 | 1 | CYCLE7 |
| CYCLE60 | 1 | 0 | 0 | 0 | CYCLE89 |
| CYCLE60 | 1 | 0 | 0 | 1 | CYCLE89 |
| CYCLE60 | 1 | 0 | 1 | 0 | CYCLE56 |
| CYCLE60 | 1 | 0 | 1 | 1 | CYCLE56 |
| CYCLE60 | 0 | 1 | 0 | 0 | CYCLE10 |
| CYCLE60 | 0 | 1 | 0 | 1 | CYCLE10 |
| CYCLE60 | 0 | 1 | 1 | 0 | CYCLE7 |
| CYCLE60 | 0 | 1 | 1 | 1 | CYCLE7 |
| CYCLE60 | 1 | 1 | 0 | 0 | CYCLE89 |
| CYCLE60 | 1 | 1 | 0 | 1 | CYCLE89 |
| CYCLE60 | 1 | 1 | 1 | 0 | CYCLE56 |
| CYCLE60 | 1 | 1 | 1 | 1 | CYCLE56 |

Each target cycle is now stored four times, corresponding to all possible binary combinations of the don't cares.

Another example embodiment may provide a design option in which the sequencer provides for an additional subarea of the output data to be used for a selector mask and/or a comparison mask for the status signals. When used as selector, a subset of status signals may be selected from multiple possible signals, e.g., by triggering multiplexers through the selector mask. The additional optional comparison mask may be used as a comparison operator for a comparator which may accordingly generate a status bit (equal/not equal) from a set of status bits. Likewise, the comparison mask may be used for deselection of don't care signals, e.g., via a normal mask operation by AND-ing according to the related art (see PACT10).

The structure of the output data is then as follows:
Data:
Address of the next cycle CONTROL signals Selector/Comparison mask A preferred sequencer may have the following structure, for example:

The address bus of a RAM-PAE used as a sequencer memory may be divided into multiple sub addresses of any width and in particular possibly also of different widths, e.g., bit 0 . . . 3 for a first subaddress (NEXT_CYCLE). Bit 4 . . . 7 for a second subaddress (SEQ_IN) and bit 8 . . . 12 for a third subaddress (CTRL_IN).

The data output of a RAM-PAE may also be divided into multiple subdata of any width and in particular possibly also of different widths, e.g., bit 0 . . . 3 for the first subdata (CYCLE), bit 4 . . . 7 for the second subdata (SEQ_OUT) and bit 8 . . . 12 for the third subdata (CTRL OUT).

The SIMD PAE and bus concepts described here may be used in particular for dividing the addresses and/or data. In addition, the division may also be made within the RAM-PAE.

Data processing PAEs, such as ALU-PAEs, may be assigned to the RAM-PAE.

The next cycle within a sequencer run may be defined by the feedback from NEXT_CYCLE to CYCLE.

In an example embodiment of the present invention, additional data processing PAEs may be provided within the feedback for computation of CYCLE as a function of NEXT_CYCLE. These PAEs may be able to respond to any signals, data or states of other PAEs and/or external/peripheral modules and in particular also to additional signals, data, or states. Furthermore, these PAEs may generate additional signals or data.

For implementation of an expanded sequencer, it is also possible to connect other PAEs whose function and/or interconnection may also be affected by the sequencer in a possible embodiment. To do so, the sequencer may transmit data into the configuration registers of the corresponding PAEs. The configuration registers may then be accessed, for example, via the architecture described in DE 197 04 728.9 (see DE 197 04 728.9, FIG. 4). The connected PAEs mainly process data of any type and may have a connection to other PAEs, in particular data processing PAEs (ALU-PAEs) and/or memory PAEs (RAM-PAEs) and/or peripheral connections (IO-PAEs). These PAEs may be triggered by control signals represented by SEQ_OUT and trigger sequence memories of the sequencer as needed through the status signals sent to SEQ_IN.

Other possibly independent PAEs or units, in particular external/peripheral units and/or higher-level CTs may also be triggered by the sequencer memory according to SEQ_IN/OUT (CTRL_OUT) and/or may trigger them (CTRL_IN).

For correct clock pulse-controlled sequence control of the sequencer pulse, synchronized registers may be built into the feedback paths.

The RAM-PAE may be configured by a higher level configuration unit and in particular the sequencer functions may be configured and defined by the content of the RAM-PAE.

In an example embodiment of the present invention, a simple sequencer may be implemented using a memory without any great additional hardware complexity. This may be possible particularly easily due to the fact that first the content of a memory cell is analyzed to determine at which location a read access is to take place next. If it is again indicated there where access is to take place next, then an automated run-through may be implemented. At the same time, however, according to this embodiment, another address for the next access is not simply determined but instead it may be specified at the same time what is to be done during the access. In other words, data or instructions may also be stored at the memory address. This may take place by some of the information stored at a location specifying the address of the next access and another portion representing instructions or data. This may be readily possible if the width of the stored data is divided into an address portion and a data/instruction portion. Furthermore, it may even be possible to encode only a portion of the memory locations addressable in the memory, e.g., to use only 8 bits of a 12-bit width. Additional bits may then be added, namely four in the present case, e.g., by analysis of flags, triggers, states, overruns, etc. This may have the advantage that different instructions may be given to the memory locations which are then addressed exactly by specifying the 8-bit address read out here and the information generated with the 4-bit analysis here. Either all triggers and the required response thereto are definable in advance or, as an alternative, at least some of the responses to individual triggers or to all triggers may be varied and/or defined during the execution of a configuration. In this regard, feedback to a trigger mask, etc., may be provided.

This may make it possible to generate conditional jumps, etc. depending on the information analyzed. If only a few of a series of information bits that are analyzable are of interest, then approximately only two bits are needed in the above example instead of four, so the information given in a corresponding memory location may also be present at those memory locations whose addresses differ only by the bits that are not of interest.

Figure 15:
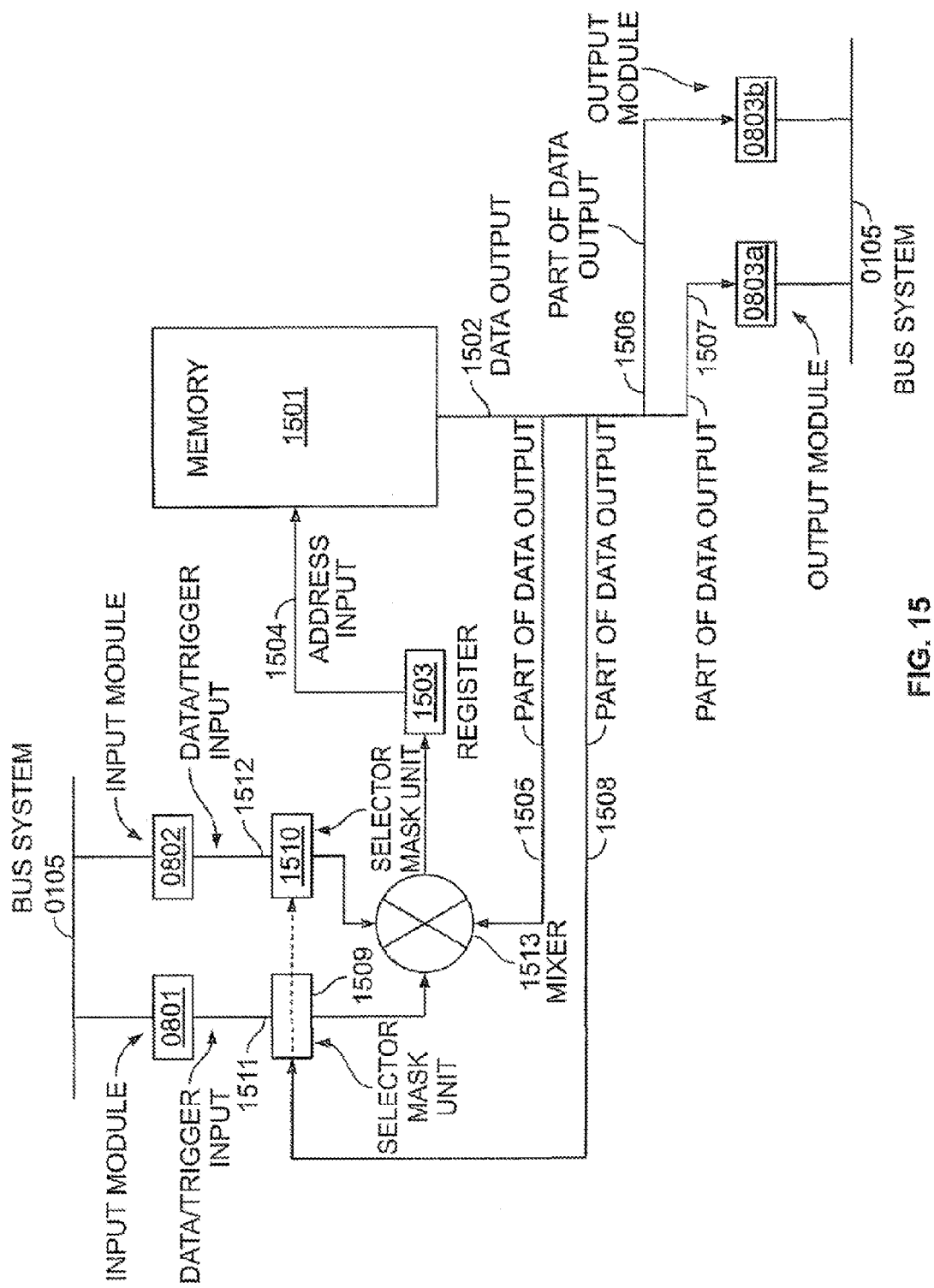
FIG. 15 is a diagram that illustrates a sequencer based on a RAM-PAE, according to an example embodiment of the present invention.

FIG. 15 shows an exemplary embodiment of a sequencer according to the present invention based on a RAM-PAE. One part (1505) of the data output (1502) of a memory (1501) may be connected back via a clock pulse-controlled register (1503) to the address input (1504) of the memory. The address input (1504) may thus correspond to CYCLE and 1505 may correspond to a portion, preferably the high portion, of NEXT CYCLE.

Optionally, a part (1508) of the data output (1502) may be connected to a selector mask unit (1509,1510) in which the SEQ_IN (1511) and/or CTRL_IN (1512) data arriving as data and/or triggers from bus system 0105 may be processed.

CTRL_IN and SEQ_IN and/or their values processed in the selector-mask unit may be mixed (1513) into 1505, e.g., in such a way that 1505 forms the high address portion and CTRL_IN/SEQ_IN forms the low address portion.

The remaining part of the data output (1502) may be separated into a SEQ_OUT part (1506) and a CTRL_OUT part (1507) and sent as data and/or triggers to bus system 0105 via output modules 0803*a, b.*

Various configuration register models for defining the configuration of locally assigned PAEs are known. PACT02 describes a sequentially processable model; PACT04 describes a FIFO model which may also be processed sequentially and configured with overlap; PACT08 describes a selective model in which certain configuration registers are selected, depending on the data processing, and thus the function and/or interconnection stored in them is selected. DE 100 28 397.7 also describes a FIFO model that is particularly suitable for pre configuration and overlapping configuration.

A combination of these models may be particularly powerful and performance/cost efficient.

The FIFO model according to DE 100 28 397.7 may be suitable in particular for preloading any number of configuration registers of PAEs because the function of the FIFO used efficiently may permit a variable configuration length. To do so, a local FIFO memory may be assigned to each PAE managed and may buffer the configurations of its assigned PAE.

Through an expansion (e.g., such as that described below) of the FIFO model, the beginning and end of a certain configuration and of the particular individual configuration entries may be defined. A plurality of configurations may then be stored in the FIFO model at the same time.

The two methods of embodiments of the present invention described below have proven to be particularly suitable for characterizing the beginning or end of configurations:

a) Characterization using additional bits (cycle bits) in each memory cell:

additional bits may be assigned to each configuration entry, characterizing the beginning and/or the end of a configuration. For example, an entry in the FIFO may appear as follows:

Bit 0 . . . 15 Bit 16 Bit 17
Configuration word
   0=don't care 0=don't care
   1=beginning 1=end The display of the beginning may be preferably omitted because it is possible to point directly to the beginning of configurations according to the method described below:

Bit 0 . . . 15 Bit 16
Configuration word
   0=don't care
   1=end b) The characterization using special configuration words that are decoded as instructions may be particularly efficient. Certain bit combinations within the configuration word may be recognized and decoded as instructions. For example, the following instructions may be implemented:

BEGIN: beginning of a configuration
END: end of a configuration

This method may be much more flexible and efficient than the characterization by cycle bits.

For a simple differentiation of instructions and configurations, a bit (like the cycle bits) that determines the semantics of the configuration word through its value may be provided, e.g., as follows:

Bit 0 . . . 15 Bit 16
Data
   0=Interpretation of the data as configuration word
   1=Interpretation of the data as instruction A configuration may be transmitted into the configuration register of a PAE from its beginning to its end, depending on the call.

Through an optional additional translation and allocation device, states (e.g., states of its own ALU and/or one or more triggers (see DE 197 04 728.9), e.g., other PAEs) may be translated to certain configurations within the FIFO model. For example, an incoming reconfiguration trigger may point to a certain configuration within the FIFO model which may then be configured by the arrival of the reconfiguration trigger.

For example, algebraic computations and/or logic operations and/or translation memories (lookup tables) may be used as the translation and allocation device.

If various configurations are stored in one, or for one, or for a number of PAEs, the addresses at which the particular information is stored may be managed in a simple manner by adding up the lengths of the particular stored configurations. This may be important when the configurations have different lengths because, in the case of certain configurations, buses and/or registers such as forward and backward registers must be configured and, in the case of others, only new functions of the ALU of a PAE are to be set or because at the same time configuration information for units external to the cell is also being managed.

It may be thus possible to implement a quasi-FIFO character. Means may be provided for adding up, in particular for successive addition of configuration lengths, as well as for freeing the particular areas when certain configurations become superfluous, e.g., because of processing, etc. Adding up may be possible, e.g., using adding chains.

This system may be used to manage configurations in a cell and/or to implement a sequencer. It is in turn possible to respond to the configurations in such a way that jumps, etc. may be implemented. It was already mentioned above that control (instruction) lines may be provided between ALU-PAEs and/or other data processing cells having an optionally expanded functionality and memory cells for implementation of sequences. Such lines having assigned controllers may also be provided within a single PAE which is independently sequencer-capable.

Figure 14:
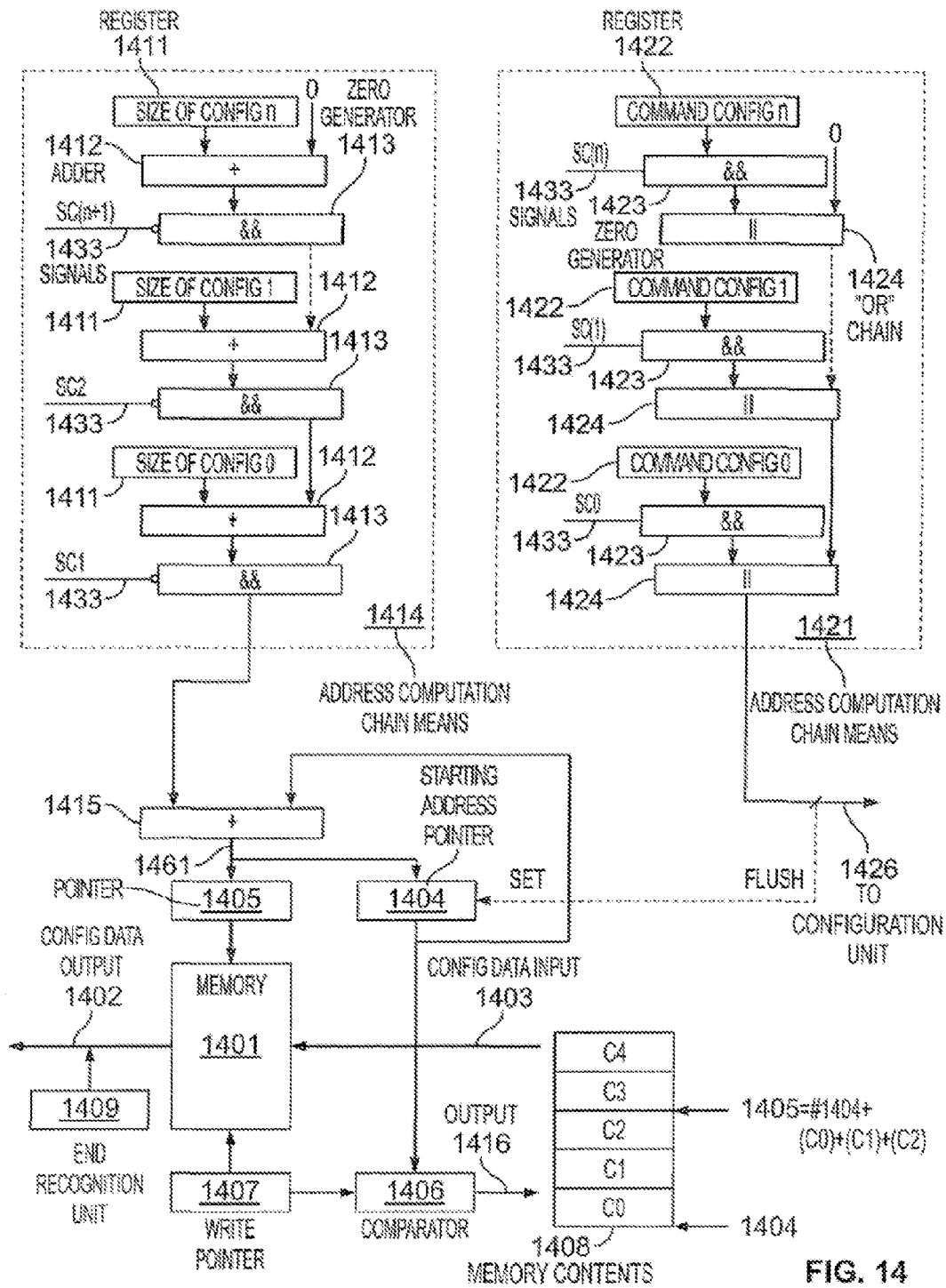
FIG. 14 is a diagram that illustrates a design of a FIFO model, according an example embodiment of the present invention.

One particular embodiment of the present invention is illustrated in FIG. 14 and may function as follows:

A chain of adders may be gated in such a way that the result (SUM) of a previous adder (P) is forwarded to a downstream adder (p+1) as the operand. Forwarding may be interrupted in such a way that instead of the result, a 0 (zero) is forwarded. As the second operand, its own register may be assigned to each adder, its value always being added to the SUM of the previous stages. Each of the stages may represent a configuration in the configuration FIFO. The relative starting position of a configuration may be stored in the register of the particular stage. The absolute starting position may then be calculated by adding up all the relative starting positions of the configurations underneath in the FIFO. This may be carried out through the adding chains as also shown in the figure.

In other words, the relative position as the lowermost configuration in the FIFO is that whose entry is stored next to the result output of the adder chain. All other relative positions then follow according to their arrangement in the FIFO.

The chain may be interrupted by adding a zero instead of the SUM at the location where the relative position of the selected configuration is reached.

The result may now be the offset between the read pointer of the FIFO which points to the lowermost configuration and the starting position of the selected configuration.

The jump address to the configuration selected may thus be easily calculable by adding the pointer and the offset.

The choice of the configuration selected may be made through different methods in the translation and allocation device.

(a) The incoming triggers may be prioritized and decoded.
(b) The incoming triggers may be translated by using a lookup table and may then be optionally prioritized and decoded.
(c) From the quantity of all triggers, a few may be selected, e.g., via multiplexers and then processed further accordingly (a, b).

A trigger may also be a vector (TRIG-V) as described in PACT08. The vector itself may be used for further decoding, i. e., the vector may select the configuration. This may be important in particular when a wave reconfiguration according to PACT 08, PACT 13, PACT 17 is to be performed in which a trigger vector transmitted with the data may select the next configuration.

During or after the configuration, configurations may be removed from the FIFO. The referencing may be adjusted here accordingly within the translation and allocation device.

Furthermore, the FIFO model may be expanded by the sequencer method according to DE 196 54 846.2-53 (and/or the patents parallel thereto as is the case with the other patents without being mentioned separately) or the method described above. For example, jumps (GOTO) and status-dependent and conditional jumps (WAIT-GOTO, IF-GOTO) may be introduced. Jumps may be represented by particular cycle bits or may be implemented as instructions.

In addition, a synchronization display method may be used, which may indicate when a certain configuration and/or a certain cycle of the sequencer is completed. In other words, each cycle may be composed of a plurality of configuration entries. A run/stop flag may be used for identification, e.g., according to DE 196 54 846.2-53. "Run" may identify here the configuration entries of a cycle, and that belong together. "Stop" may identify the first entry of a following cycle. As an alternative, use of the cycle bits described above may also be possible, although they have slightly different semantics but otherwise behave the same way.

As an alternative or in addition to these methods, the instructions WAIT and BEGIN, which are also known from previous patent applications by the present applicant, or preferably the instructions BEGIN and END described above, may also be used.

The end of a cycle may be identified by "stop" or WAIT or END, i. e., a configuration is complete and may be executed and processed. The next cycle may be executed after the end of data processing of this configuration. The end may be defined by a clock pulse (instruction sequencing) according to sequential processors and/or it may be defined according to the data processing principle of the PACT processors (P 44 16 881.0-53, DE 196 54 846.2-53, configuration sequencing) by a status signal (e.g., a trigger).

In other words, "stop" may be skipped through the arrival of a trigger, and the following configurations may be configured. Alternatively or additionally, the instruction WAIT may be used, i. e., waiting for arrival of a trigger.

Optionally, a FIFO may trigger not only the locally assigned PAE but also other PAEs, in particular those nearby or belonging to the same configuration.

The FIFO may optionally also be designed as a dedicated unit according to DE 196 54 846.2-53.

Further Exemplary Embodiments

A) An incoming trigger may be translated to a configuration (K1) located in the FIFO by a translation and allocation device. This configuration (K1) may then be configured into the PAE. As the end identifier, for example, a WAIT instruction, an END instruction, or the run/stop flag may be used.

A trigger arriving subsequently may be translated to another configuration (K2) located in the FIFO via a translation and allocation device. This configuration (K2) may then be configured into the PAE. K1 and/or K2 may be deleted from the FIFO after successful configuration into the PAE.

B) An incoming trigger may be translated to a configuration (K3) located in the FIFO made up of multiple cycles (Cy1, Cy2, Cy3a, Cy3b, Cy4) via a translation and allocation device. The first cycle (Cy 1) may then be configured into the PAE and executed. A WAIT instruction or the run/stop flag may be used as the end identifier, for example. A trigger arriving subsequently, indicating the end of execution of the cycle, may trigger the configuration and the execution of Cy2. Cy2 may end with two WAIT-GOTO instructions (WAIT-GOTO (Trg1, Cy3a); WAIT-GOTO (Trg2, Cy3b>> (see PACT04). As a result, Trg1 and Trg2 may respond to two different triggers that indicate the end of execution of the cycle. When Trg1 arrives, then Cy3a may be configured in the next cycle and executed; when Trg2 arrives, Cy3b may be configured and executed.

Cy3 and Cy3b may end with a WAIT-GOTO (Trg, Cy4). On arrival of a trigger which indicates the end of execution of the cycle, the sequence may jump to Cy4 and the configuration may be configured and executed accordingly.

Cy4 may end with a WAIT-GOTO (Trg, Cy1) so that the renewed sequential run-through of a loop may begin on the arrival of the trigger that indicates the end of execution of the cycle. To this extent, by jumping to Cy1, a ring memory according to DE 196 54 846.2-53 may be formed for execution of loops, such a ring memory being advantageous but not obligatory.

The loop may be terminated by the arrival of a trigger (Trg-x). If there is an entry for Trg-x in the translation and allocation device, the loop may be terminated at any point in time and the configuration (KX) referenced by Trg-X in the translation and allocation device may be executed.

If there is no entry, then through explicit use of WAIT-GOTO (Trg-x, KX) instructions, e.g., together with WAIT-GOTO (Trg, Cy1) in Cy4, the loop may be terminated at certain predetermined points in time in the execution.

Figure 13:
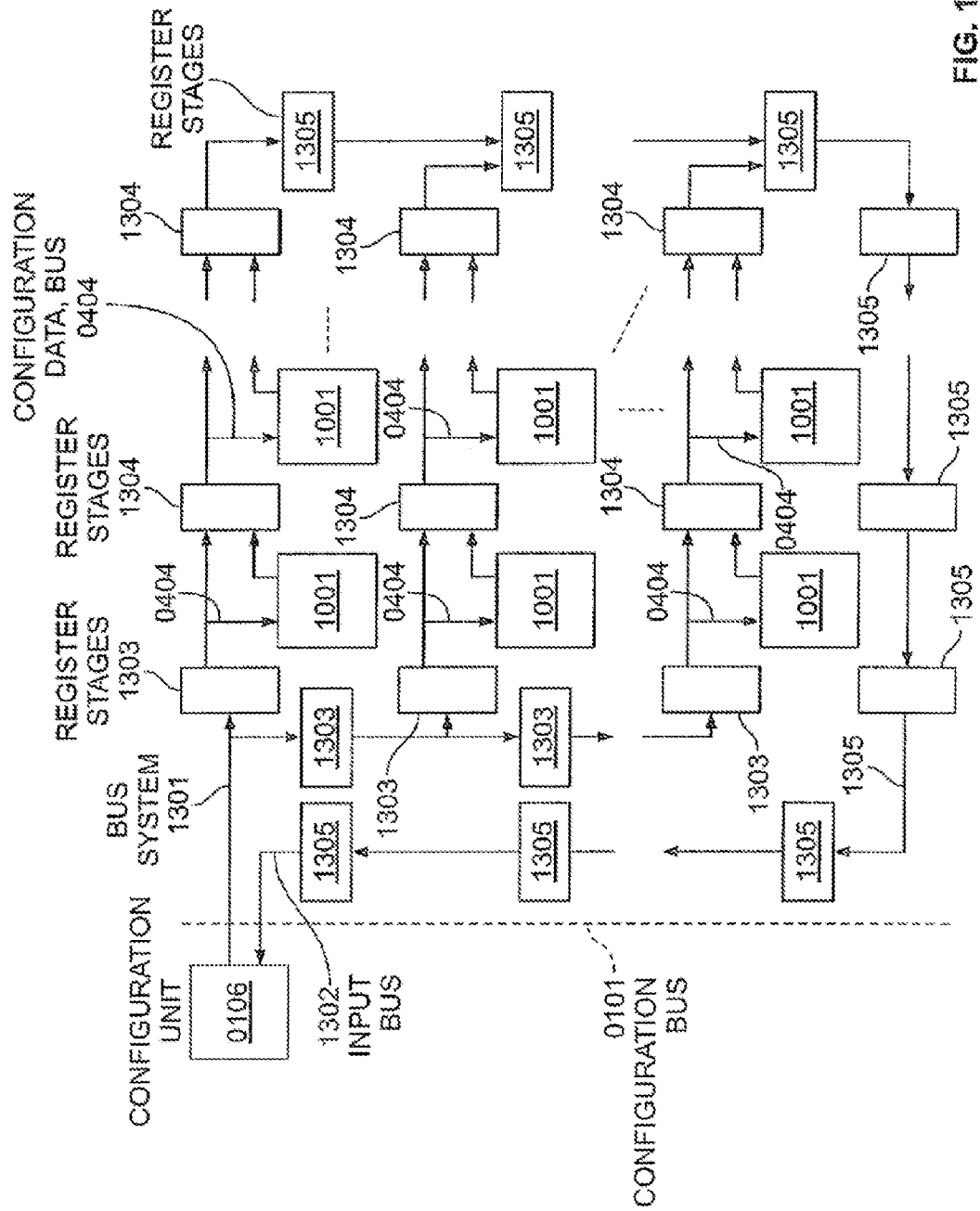
FIG. 13 is a diagram that illustrates an exemplary design of a configuration bus for configuration of PAEs by a configuration unit, according to an example embodiment of the present invention.

FIG. 13 shows as an example the design of a configuration bus for configuration of PAEs (1001) by a configuration unit (0106). The configuration unit may send configuration data over a bus system (1301) and optionally over multiple register stages (1303, 1304) to improve the frequency response and over the configuration data bus (0404) to PAEs (1001). Each PAE may decode the applied addresses and respond to the data transmission of the bus if it has been selected. PAEs may in turn send data onto the bus system via 0404 and via register-multiplexer stages (1304), the configuration unit, and/or optionally other PAEs. This may be carried out by transmission of the address of the receiving unit. The reverse transmission of the data to the configuration unit may also takes place through register stages (1305) to the data input bus of the configuration unit (1302).

A mode of operation of the configuration bus is also described in DE 101 42 904.5 and DE 100 28 397.7, the full content of which is incorporated herein by reference.

FIG. 14 shows the design of a FIFO model according to an example embodiment of the present invention for controlling the reconfiguration. The FIFO model presented here may differ from pure FIFOs known from the related art in particular in the capability to perform jumps. Nevertheless, the terminology used in the related art has been used here because this makes it possible to associate a particularly visual image of the typical jump-free operation. This unit is optional to all cells (PAEs), in particular the reconfigurable cells described in these patent applications and depicted in FIG. 4 as unit 0406.

A memory (1401) may contain the configuration data for the respective PAE, where (1402) is the configuration data output to the configuration registers of the PAE (0405). The configuration unit may write configurations into the memory via 1403, i.e., bus 0404, and the particular address may be generated by the write pointer (1407), the shift register being altered by a value of 1 for each writing operation, i.e., either incrementally or decrementally, depending on the operation of the FIFO. A starting address pointer (1404) may point to the first configuration data entry in the memory while another pointer (1405) points to the first configuration data entry in the memory to be read and/or to be transmitted to the PAE. With each data transmission from the memory to the PAE, 1405 may be incremented or decremented by a value of 1, depending on the operation of the FIFO. The data transmission may take place until the end of the configuration is recognized by a configuration end recognition unit (1409), e.g., on the basis of a cycle bit or instruction (WAIT, END).

The FIFO implemented does not correspond to normal FIFOs according to the related art which have only pointer 1405. The modification may permit any configuration data to be read out of the memory while pointer 1404 prevents any configuration data that might still be needed from being overwritten. This may be accomplished by generating a full flag using the comparison (1406) of the starting address pointer (1404) with the write pointer (1407). If the memory is full, then write attempts on the part of the configuration unit may be rejected. This may be accomplished by the ACK1REJ protocol which is known from PACTIO. Comparator 1406 may then give an appropriate reject signal to the configuration unit, i.e., does not output an ACK at its output 1416.

An example of the memory contents of 1401 is shown as 1408. This memory contains five configurations (C0 ... C4). 1404 points as a starting pointer to the first configuration C0. In this example, 1405 points to the beginning of configuration C3. The pointer position may be calculated from the value of 1404 plus the length of configuration C0 plus the length of configuration C1 plus the length of configuration C2.

Figure 14A:
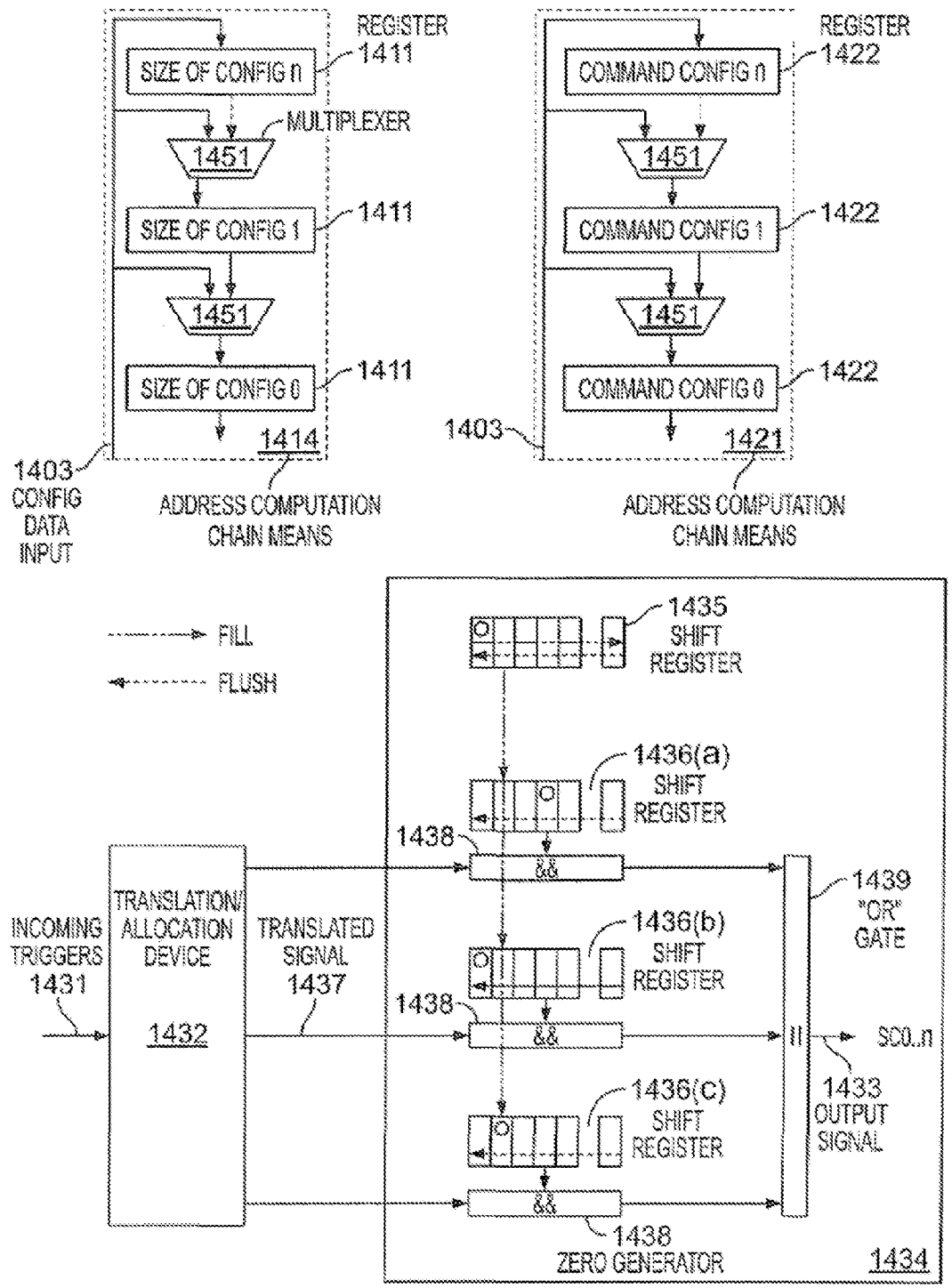
FIGS. 14A and 14B are diagrams illustrating further details of the embodiment illustrated in FIG. 14, according to an example embodiment of the present invention.

Incoming triggers (1431) may be translated via a translation and allocation device (1432) depicted in FIG. 14A to select signals (SC0 ... n, 1433) which control the addressing of the configuration data in the memory. This translation and allocation device may perform its allocation in a fixedly predetermined manner but may be variable during processing of a configuration, to which end suitable feedbacks, signal lines, etc. may be provided. In particular, when the translation and allocation device is variable, unit 1431, which may be used for the allocation, may also be designed to be variable during data processing. Here again, corresponding circuit systems may be provided, in which the change in the allocation may take place in a programmed-controlled manner in particular. A corresponding change, in particular a program-controlled change, is also possible for unit 1414, i.e., the address computation addition chain means. The instructions triggering this updating and/or new behavior may be stored in memory unit 1404 for this purpose.

One register (1411), one adder (1412), and one zero generator (1413), implemented here by a bit-by-bit AND function, for example, together may form an element of a chain (1414) for address calculation. One element may manage the offset of each configuration. The sequence of the elements in a row corresponds to the sequence of configurations in a row of memory 1401. In other words, the first element may have the length of configuration C0 in accordance with example 1408, i.e., it has the offset that is to be added to 1404 to point to configuration C1. The second element may have the length of configuration C1, i.e., the offset that is to be added to the offset of C0 and to 1404 to point to configuration C2. The third element may have the length of configuration C2, i.e., the offset that is to be added to the offset of C0 and to the offset of C1 and to 1404 to point to configuration C3 and so forth.

It may be seen on the basis of this discussion that the result is a chain of additions in which the number of links corresponds to the position of the configuration in the memory. This may be implemented by chain 1414 as follows:

The value stored in the register, i.e., the length of the particular configuration, may be added to the result of the previous link via the adder. The value at the input of the bit-by-bit AND function may be AND-ed with all result bits of the adder. Thus, if the input is equal to zero, the AND function may deliver a binary zero at the output to terminate the adder chain at the configuration to be selected; otherwise, it may deliver the value of the adder output.

In other words, the size of the configurations may be entered into the registers (1411) in their order in the memory (1401). The select signals may be sent to the zero generators in such a way that the configuration sizes are added up to the starting address of the configuration referenced by the triggers (1431).

Thus, the chain may add up all the lengths of configurations which are in memory 1401 before the configuration to be loaded. Thus, an offset may be formed, which, by addition (1415) with the starting address (1404), points to the configuration to be loaded.

The circuit described here may be particularly efficient because it permits calculation of the offset and the jump within one clock pulse.

In a second optional chain (1421), instructions to the configuration unit, the PAE, and/or the configuration stack may be stored in registers (1422). A zero function (1423), here also implemented as an example similarly to zero function 1413, may deliver a binary zero at its output if the select signal is not active, i.e., the configuration has not been selected; otherwise, it may deliver the register contents (1422), i.e., the instruction. All zero function outputs may be OR-ed together via an OR chain (1424) in such a way that the instruction in register 1422 of the configuration currently selected is applied to the output (1425) of the chain.

The instruction may now be used to delete entries in the memory (1401), i.e., one of the possible instructions may be that certain stored configurations are to be deleted and/or allowed to be overwritten. This may be accomplished, for example, by the FLUSH instruction which may load the starting pointer (1404) with reading pointer 1405 and thus allow all data before this address to be overwritten. This may be preferable inasmuch as the configurations thus to be overwritten in the FIFO-like memory are usually older and therefore typically may be overwritten while the more recent configurations, which are often still needed, are higher up in the quasi-FIFO-like memory. Another instruction that may be implemented is that new configurations are to be loaded. This may be important when the requirement that a certain new configuration is needed is predictable with at least a non-negligible probability. This instruction may be issued to a central configuration management unit or the like. Direct loading is likewise possible, e.g., with assignment of IO options. It is also preferable if both the configuration request instruction as well as the flush and/or old configuration relinquishment instruction are simultaneously executable and/or storable. Instructions such as flush, load, or flush/load may also be stored in other memory areas and/or units such as 1401, and a dedicated unit such as 1421 need not necessarily be provided for this. This use of a unit that is already present may be preferable in terms of the hardware.

In addition, the instruction may be sent to the configuration unit (1426) via the bus system according to FIG. 13. For example, the instruction may trigger the start of a certain configuration there and/or cause a configuration to be preloaded.

FLUSH, i.e., deletion of configurations, may be one important and preferred instruction of the unit. The instruction may be very advantageous for execution, but it may have the problem that during its execution all the addresses and references change. The FIFO is "flushed" in that the start pointer (1404) is set at a new start address. It may be set at the beginning of a stored configuration, as depicted in FIG. 14, the beginning being determined by the computation previously described, via the offset. Alternatively or additionally, the pointer may also be set at a certain other value, e.g., a constant coupled to the flush instructions. In addition, it may be required for both chains 1414 and 1421 to be flushed in such a way that the address calculation corresponds to the revised positions of the configurations in memory 1401, using multiplexers (1451) (not shown in FIG. 14) through which the register data is transmitted forward in such a way that the elements of the chain that are now empty (flushed) are overwritten with the data of the following elements, namely in such a way that a) the sequence of data in the chain remains unchanged, b) the first link of the chain is occupied by new data, and c) all other data is written linearly in order and without a gap into the elements following the first (see FIG. 14A in this regard). Data pertaining to the configuration size may also be written from the outside to the corresponding locations (size of Config 1 . . . n) via multiplexer 1451. It may be estimated here (but this is not shown for the sake of simplicity of the drawing) that each location is individually addressable. Reference is made in this regard to unit 1435, which is shown in 1434 and determines this location.

Due to the shift within the chains, the select signals (SCO . . . n) may now be adapted to the new position of the data in the chains so that a correct assignment of the select signals to the offset calculation is again obtained. Essentially, several methods are available for doing so. For example,
a) signals may be encoded in binary form (corresponding to the function of a 74 LS 148) after 1432 in 1434, an offset corresponding to the shift resulting from the flush may be subtracted, and the resulting value may be decoded again (corresponding to the function of a 74LS 139) to generate select signals 1433; and b) signals may be translated by a lookup table to select signals 1433 after 1432 in 1434. Therefore, the lookup table may be adapted to the position in the chains which has been changed by the flush.

One exemplary method for the translation of the signals, according to an example embodiment of the present invention, is to be described in detail and corresponds to the device drawn in element 1434:

A first shift register (1435) may contain as a one-bit value the position of the currently first free, i.e., unused, element in chains 1414, 1421. This may be carried out as follows: after a reset, the low bit in the shift register may be set at 1 (represented by a solid circle). The low bit (bit 0) is referenced to the lowermost element in the chains. With each write access to the chains, i. e., with each new addition to the memory (FILL) of a configuration after 1401, the shift register may shift the set bit (PBTT) by one position in the direction of the highest bit and thus reference the following element in the chains. The highest bit may thus reference the highest element in the chains, i. e., the shift register is as wide as elements present in the chains. With each FLUSH, the shift register may shift the bit (PBIT) in the direction of the low bit by exactly as many positions as elements in the chain were deleted.

The translation and allocation device (1432) may translate triggers incoming at the PAE from the bus system (0105*a*, FIG. 4) in such a way that exactly one signal of the outgoing bus (1437) is set for each trigger. A shift register (1436) of the same size as 1435 may be assigned to each signal. Thus, there may be a plurality of shift registers 1436 (shown in the present case as 1436*a* . . . 1436*c*), the number of which corresponds to the number of maximum allowed different trigger signals and the length, i.e., the bit width of which corresponds to the number of maximum allowed configurations, i.e., the number of chain elements. When a configuration is stored again (FILL), before shifting PBIT, the content of 1435 may be written into the shift register (1436) to which the trigger assigned to the configuration points; it is represented by a circle.

On arrival of the trigger on the bus, the corresponding translated signal (1437) may deliver a one-value while all other signals deliver a zero-value. Signals 1437 may be sent to zero generators (1438), composed of a bit-by-bit AND function. All zero generators whose input signal from 1437 has a zero-value may deliver a zero vector at the output. The zero generator whose input signal from 1437 has a value of 1 may transmit the contents of shift register 1436. The outputs of all zero generators may be supplied to an OR gate (1439) in such a way that the select signals seo . . . n (1433) are formed.

Due to this function, an incoming trigger may now point, via the zero functions, to a shift register 1436 whose set bit in turn points to an element in the chains (1414, 1421).

In the event of a flush, shift registers 1436, like shift register 1435, may shift the stored value by exactly the same number of positions as elements deleted in the chains in the direction of the low bit. If the contents of a shift register are equal to zero after this operation, because the PBIT has been shifted beyond the lowest bit, this may mean that the configuration referenced previously has been deleted.

If 1434 supplies a value of zero at output 1433 for an incoming trigger 1431, a configuration request may be sent to the configuration unit to load the missing configuration or, if necessary, may also report an error status to the configuration unit.

Translation of the incoming triggers 1431 to 1437 in 1432 may take place according to multiple principles which may be used individually or jointly, e.g.:
1. Decoder corresponding to the function of a 74 LS 148
2. Round-robin arbiter (see PACTIO)
3. Lookup table (see PACTIO)

In principle, the translation may correspond to the method described in PACTIO (round-robin arbiter, LUT1).

If there is no translation specified, e.g., when using lookup tables, then a configuration request may be sent to the configuration unit in order to load the missing configuration or, if necessary, report an error status to the configuration unit.

Figure 14B:
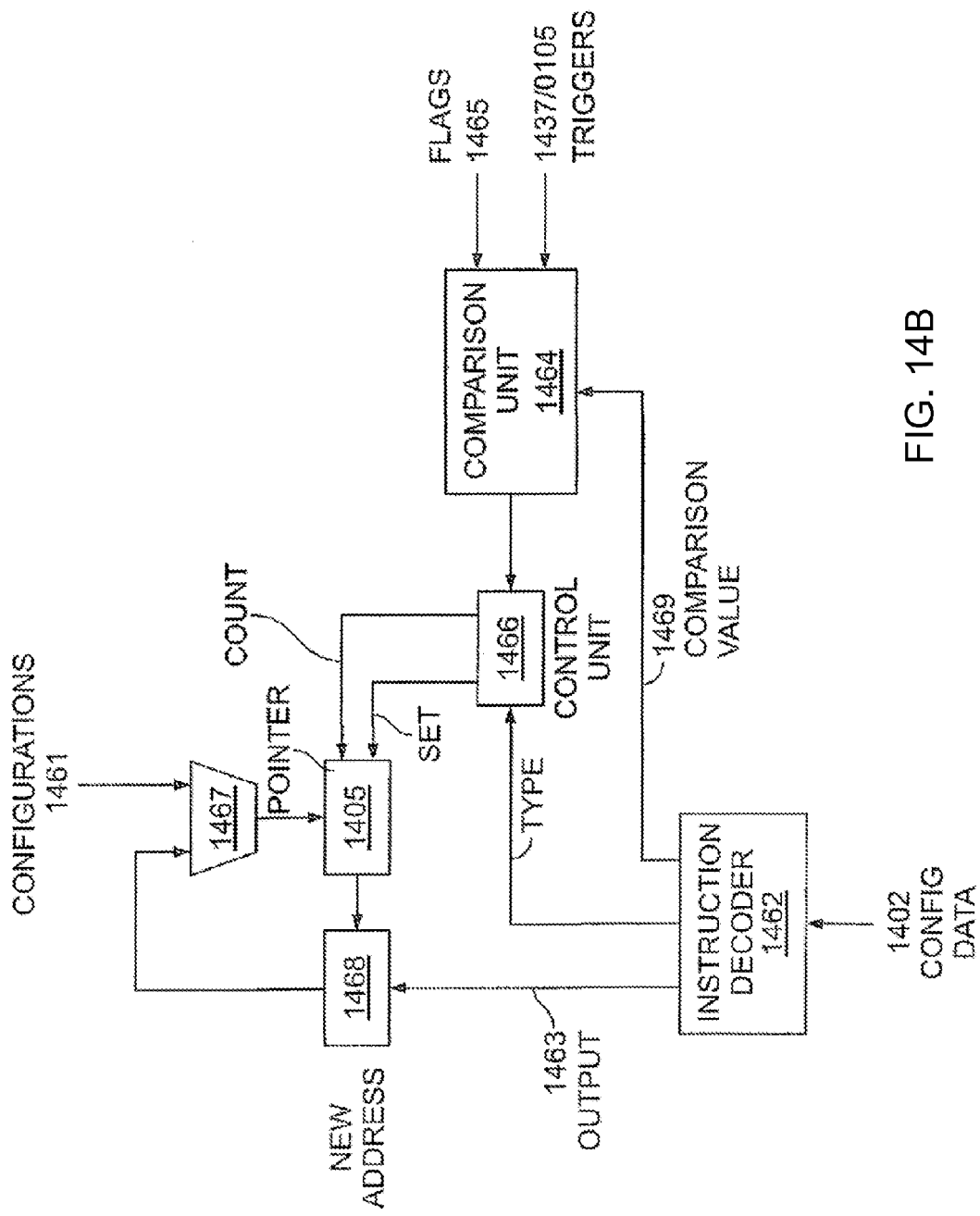

Another important function of the configuration stack according to FIG. 14 is that of sequencing over configurations, which means conditional and unconditional jumps within memory 1401. Therefore, this function is also described in detail in conjunction with FIG. 14B.

An instruction decoder (1462) may recognize conditional and unconditional jump instructions in configuration words (1402) when reading out of the memory 1401. A jump instruction may be assigned the relative jump address to the current position as a constant. Then the instruction decoder may be decoded and output (1463). This value is either positive or negative depending on the direction of the jump.

In addition, a comparison value (1469) may be given as a constant with the incoming triggers or the status flags of the PAE, e.g., the ALU flags zero, carry, negative, overflow, etc. or the memory flags full, empty, etc., conditional jumps being performed as a function of these. This may be conveyed to a comparison unit 1464 which compares the value with the flags (1465) and/or triggers which originate from the output of the translation and allocation device (1437) and/or directly from bus system 0105.

A control unit (1466) may generate the triggering for the reading pointer (1405) as a function of the instruction (conditional or unconditional jump="type") and as a function of the result of the comparison as follows:

Unconditional jump: generate "set" so as to load new address after 1405;
Conditional jump, comparison satisfied: generate "set" to load new address after 1405; and
Conditional jump, comparison not satisfied: generate "count" to compute address of the following instruction in 1405.

A new address may be set by adding up (1468) the relative jump address (1463) to the current value of 1405. The new address may be written into read pointer 1405 when "set" is applied via a multiplexer (1467) which selects between the new address added up and the start address of configurations (1461) generated by 1415.

The mode of operation of the configuration stack may make the use of configuration units (CT) such as those known largely from PACT10 and PACT17 obsolete and instead a distributed parallel CT may be formed by the configuration stacks.

However, two functions of the CT may be preserved in such a unit:
1. Loading the configurations from a memory, which may be implemented internally within the chip or externally, may be designed as a volatile or nonvolatile memory (RAM, EPROM, EEPROM, Flash ROM, etc.) and/or may be a bulk memory. This may now take place through a simple microcontroller which sends data to the PAEs and responds to the acknowledgment sent back to it. For example, the unit of PACT05 may be used as the micro controller and/or the algorithm described in PACT05 may be used. The loading need no longer be necessarily active but instead it is sufficient if a unit is present which causes the new configuration data to be retrieved into the particular PAE and/or its particular configuration memory in response to the configuration request instruction. This may be for example, e.g., with the IO-PAEs discussed above, the PAE itself which currently requires new configuration data.
2. The remaining unit may be used to ensure that reconfiguration triggers (WCT) are running through the array, sorted in a certain order, that preloaded configurations are processed in the required order, and/or that configurations that are as yet unloaded but are needed are requested and/or loaded as required. This reconfiguration trigger prioritization may be used to prioritize which reconfiguration request triggers should be responded to first. This may ensure conflict-free processing of different possible configurations by determining only which trigger first runs through the array. If such a trigger pertains to a certain PAE which is to respond to this trigger, then the PAE may take note of this in order to be able to respond to this trigger next as soon as it is reconfigurable. An individual cell or cell structure or the like may notice the triggers relating to the configurations to be processed immediately thereafter. Additionally, all other configurations or at least multiple configurations to be processed by this cell in the future may and/or should be saved in the proper order so that each cell or cell group may receive the information from the trigger vectors and keep the information pertaining to it in the future and/or currently. The FILMO function of the earlier CT may thus become superfluous and may be essentially replaced by the time characteristic of the trigger vectors.
3. If only one reconfiguration trigger is used, no particular measures are necessary. If a plurality of reconfiguration triggers (WCT) may occur, it may be required for them to run through the array without any time overlap, i.e., one after the other in a fixed order and without crossing in order to prevent deadlocks.

Figure 16:
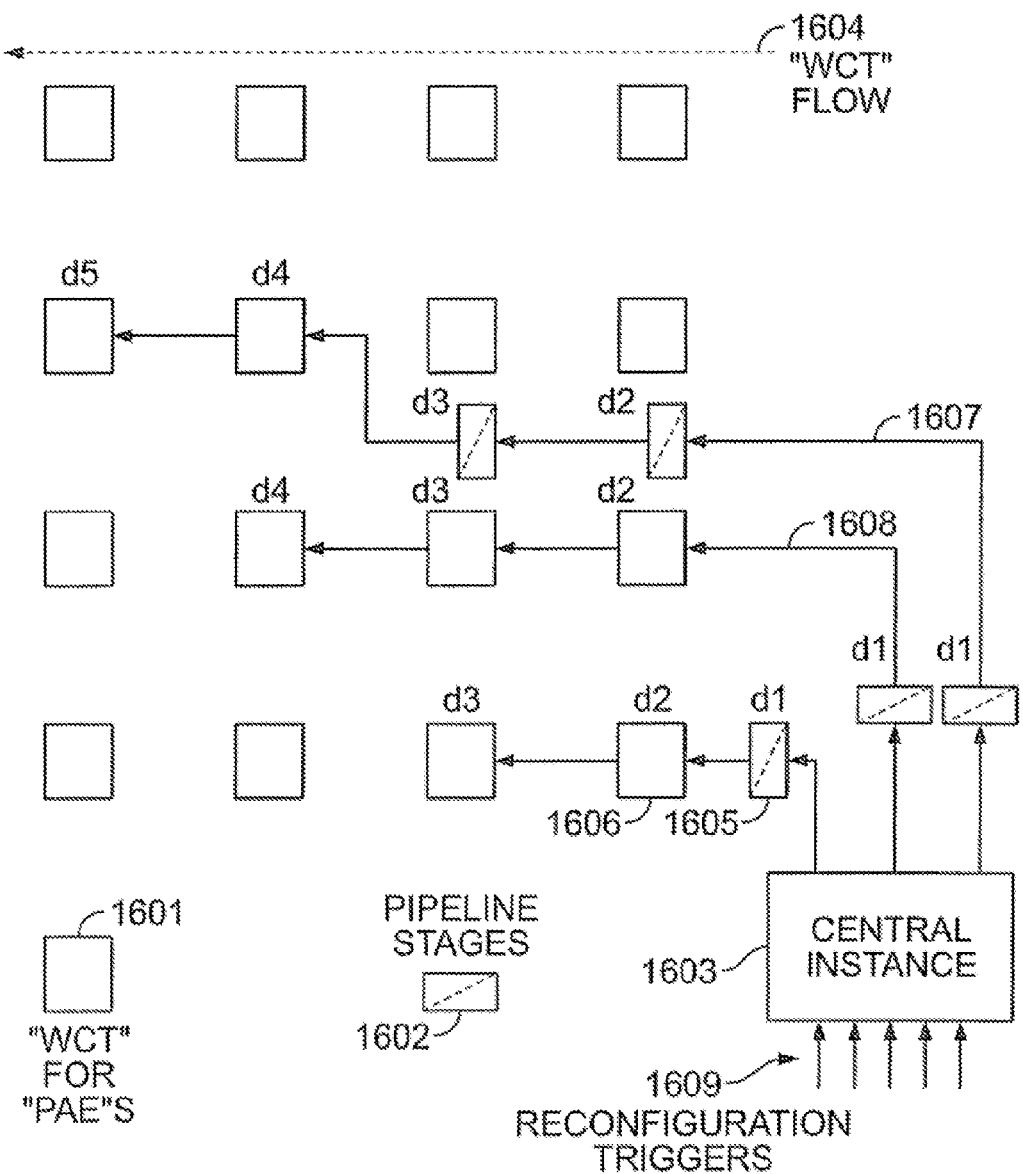
FIG. 16 is a diagram that illustrates transmission of reconfiguration triggers, according to an example embodiment of the present invention.

This may be ensured by the method depicted in FIG. 16 in which routing measures may ensure a correct forwarding of WCT over time. A plurality of WCTs for different PAEs (1601) may be generated by a central instance (1603) but they should be coordinated in time with one another. The different distances of the 1601 in the matrix may result in different run times, i. c., latency times. In the present example, this may be achieved through suitable use of pipeline stages (1602) by the router assigned to the compiler (see PACT13). The resulting latencies are given as d1 through d5. It is apparent that the same latencies occur in each stage (column) in the direction of the WCT flow (1604). For example, 1605 would not be necessary because the distance of 1606 from 1603 is very small. However, it may be required for one 1602 to be inserted for each 1607 and 1608 because of the resulting run-time due to the longer distance, so 1605 may be necessary for compensation of the run-time. Central instance 1603 may pick up reconfiguration triggers (1609) incoming from the PAEs, prioritize them, and then send them individually and in succession as WCTs to the array of PAEs. In other words, it may be that a PAE which generates a reconfiguration trigger does not send it directly to other PAEs but instead sends it exclusively to central instance 1603.

The central instance may saves and prioritize incoming reconfiguration triggers. To do so, the SCRR-ARB method known from PACT10 may be used, as described in detail in PACT10 (FIG. 8). All the PACT protective rights mentioned here are incorporated herein in their entirety by reference.

The invention claimed is:

1. A multi-processor device, comprising:
a plurality of data processing cores on a first die;
a plurality of memory elements on at least a second die;
an interconnection network interconnecting the first and at least second die, the interconnection network located on a third die.

2. An integrated device, comprising:
three stacked dies comprising, lower, middle and top dies;
a plurality of processors on the lower die;
a plurality of memory elements on the top die; and
an interconnection network on the middle die.

3. The integrated device of claim 2, wherein the top die has higher heat dissipation than the middle and lower dies.

4. A processor system, comprising:
a plurality of stacked dies having a first outer die and a second outer die that each permit high heat dissipation, and at least one inner die that has low heat dissipation;
a plurality of processors located on the first outer die;
a plurality of memory elements located on the second outer die; and
an interconnect structure located on the at least one inner die.

* * * * *